US009748905B2

(12) United States Patent
Scott et al.

(10) Patent No.: US 9,748,905 B2
(45) Date of Patent: Aug. 29, 2017

(54) RF REPLICATOR FOR ACCURATE MODULATED AMPLITUDE AND PHASE MEASUREMENT

(71) Applicant: RF Micro Devices (Cayman Islands), Ltd., George Town, Grand Cayman (KY)

(72) Inventors: Baker Scott, San Jose, CA (US); Dirk Robert Walter Leipold, San Jose, CA (US); George Maxim, Saratoga, CA (US)

(73) Assignee: Qorvo US, Inc., Greensboro, NC (US)

( * ) Notice: Subject to any disclaimer, the term of this patent is extended or adjusted under 35 U.S.C. 154(b) by 0 days.

(21) Appl. No.: 14/216,560

(22) Filed: Mar. 17, 2014

(65) Prior Publication Data

US 2014/0266458 A1  Sep. 18, 2014

Related U.S. Application Data

(60) Provisional application No. 61/793,583, filed on Mar. 15, 2013, provisional application No. 61/789,508, (Continued)

(51) Int. Cl.
*H03F 1/32* (2006.01)
*H03F 3/195* (2006.01)
(Continued)

(52) U.S. Cl.
CPC ........... *H03F 1/3241* (2013.01); *H01F 27/28* (2013.01); *H01F 27/385* (2013.01); *H03F 1/32* (2013.01);
(Continued)

(58) Field of Classification Search
CPC .......... H03F 1/0261; H03F 1/30; H03F 1/302; H03F 2200/18; H03F 1/223; H03F 1/22;
(Continued)

(56) References Cited

U.S. PATENT DOCUMENTS 5,339,017 A   8/1994  Yang
5,420,536 A   5/1995  Faulkner et al.
(Continued)

FOREIGN PATENT DOCUMENTS

EP   1184977 A2   3/2002
WO   2005117255 A1  12/2005

OTHER PUBLICATIONS

Bogya, Robert I., et al., "Linear Radio Frequency Power Amplifier Design Using Nonlinear Feedback Linearization Techniques," presented at the 60th Vehicular Technology Conference, vol. 3, Sep. 26-29, 2004, IEEE, pp. 2259-2263.
(Continued)

*Primary Examiner* — Khanh V Nguyen
(74) *Attorney, Agent, or Firm* — Withrow & Terranova, P.L.L.C.

(57) ABSTRACT

The disclosure provides a communication circuit including an amplification circuit, a replicator circuit, and a correction circuit. Specifically, the amplification circuit generates an amplified signal. The replicator circuit emulates the amplification circuit and generates a replicated signal that approximates the amplified signal. The replicated signal is used by the correction circuit to generate control signals for controlling the amplification circuit.

28 Claims, 17 Drawing Sheets

BLOCK DIAGRAM

Related U.S. Application Data filed on Mar. 15, 2013, provisional application No. 61/800,772, filed on Mar. 15, 2013, provisional application No. 61/800,991, filed on Mar. 15, 2013, provisional application No. 61/801,038, filed on Mar. 15, 2013, provisional application No. 61/946,270, filed on Feb. 28, 2014, provisional application No. 61/946,927, filed on Mar. 3, 2014.

(51) Int. Cl.

| | |
|---|---|
| *H03F 3/21* | (2006.01) |
| *H03F 3/19* | (2006.01) |
| *H03F 3/213* | (2006.01) |
| *H01F 27/28* | (2006.01) |
| *H01F 27/38* | (2006.01) |
| *H03H 7/09* | (2006.01) |
| *H03H 7/01* | (2006.01) |
| *H03F 1/34* | (2006.01) |
| *H03F 1/22* | (2006.01) |

(52) U.S. Cl.
CPC .............. *H03F 3/19* (2013.01); *H03F 3/195* (2013.01); *H03F 3/211* (2013.01); *H03F 3/213* (2013.01); *H03H 7/09* (2013.01); *H03H 7/1775* (2013.01); *H03F 1/22* (2013.01); *H03F 1/34* (2013.01)

(58) Field of Classification Search
CPC ......... H03F 2200/294; H03F 2200/372; H03F 3/193; H03G 3/3042; H03G 3/3047
USPC .......................................... 330/285, 296, 311
See application file for complete search history.

(56) References Cited

U.S. PATENT DOCUMENTS

| | | | |
|---|---|---|---|
| 5,507,014 A | | 4/1996 | Wray et al. |
| 5,675,288 A | | 10/1997 | Peyrotte et al. |
| 6,137,354 A | * | 10/2000 | Dacus et al. ................... 330/311 |
| 6,330,289 B1 | | 12/2001 | Keashly et al. |
| 6,617,925 B2 | * | 9/2003 | Hoang ........... H03K 19/018528 |
| | | | 330/253 |
| 6,707,338 B2 | | 3/2004 | Kenington et al. |
| 6,819,938 B2 | | 11/2004 | Sahota |
| 6,836,517 B2 | | 12/2004 | Nagatani et al. |
| 6,980,774 B2 | | 12/2005 | Shi |
| 7,102,430 B2 | | 9/2006 | Johnson et al. |
| 7,164,313 B2 | | 1/2007 | Capofreddi et al. |
| 7,212,798 B1 | | 5/2007 | Adams et al. |
| 7,250,815 B2 | | 7/2007 | Taylor et al. |
| 7,317,353 B2 | | 1/2008 | Hayase |
| 7,321,264 B2 | | 1/2008 | Kokkeler |
| 7,333,557 B2 | | 2/2008 | Rashev et al. |
| 7,340,229 B2 | | 3/2008 | Nakayama et al. |
| 7,471,739 B1 | | 12/2008 | Wright |
| 7,652,532 B2 | | 1/2010 | Li et al. |
| 7,809,349 B1 | | 10/2010 | Granger-Jones et al. |
| 7,917,106 B2 | | 3/2011 | Drogi et al. |
| 7,970,360 B2 | | 6/2011 | Pei |
| 8,013,674 B2 | | 9/2011 | Drogi et al. |
| 8,126,409 B2 | | 2/2012 | Osman et al. |
| 8,175,551 B2 | | 5/2012 | Akaiwa |
| 8,344,806 B1 | * | 1/2013 | Franck et al. ................. 330/285 |
| 8,346,179 B2 | | 1/2013 | Brunn et al. |
| 8,410,846 B2 | | 4/2013 | Zare-Hoseini |
| 8,620,233 B2 | | 12/2013 | Brobston |
| 8,624,678 B2 | * | 1/2014 | Scott ..................... H03F 1/0272 |
| | | | 330/285 |
| 8,653,888 B2 | | 2/2014 | Watanabe |
| 8,653,890 B1 | | 2/2014 | Ahmed et al. |
| 8,736,511 B2 | | 5/2014 | Morris, III |
| 8,749,310 B2 | * | 6/2014 | Hayes ......................... 330/285 |
| 8,791,769 B2 | | 7/2014 | Leong et al. |
| 8,829,995 B2 | | 9/2014 | Cohen |
| 8,841,983 B2 | | 9/2014 | Newton et al. |
| 9,094,104 B2 | | 7/2015 | Din et al. |
| 9,124,355 B2 | | 9/2015 | Black et al. |
| 9,203,455 B2 | | 12/2015 | Yang et al. |
| 2002/0057139 A1 | | 5/2002 | Matsumura et al. |
| 2002/0186378 A1 | | 12/2002 | Tazartes et al. |
| 2002/0190795 A1 | * | 12/2002 | Hoang ........... H03K 19/018528 |
| | | | 330/258 |
| 2003/0008577 A1 | | 1/2003 | Quigley et al. |
| 2003/0151409 A1 | | 8/2003 | Marek |
| 2004/0121741 A1 | | 6/2004 | Rashev et al. |
| 2004/0162042 A1 | | 8/2004 | Chen et al. |
| 2004/0196085 A1 | | 10/2004 | Shen |
| 2004/0222868 A1 | | 11/2004 | Rathgeber et al. |
| 2005/0123064 A1 | | 6/2005 | Ben-Ayun et al. |
| 2005/0195063 A1 | | 9/2005 | Mattsson |
| 2005/0237144 A1 | | 10/2005 | Einzinger et al. |
| 2006/0033602 A1 | | 2/2006 | Mattsson |
| 2006/0125465 A1 | | 6/2006 | Xiang et al. |
| 2006/0226943 A1 | | 10/2006 | Marques |
| 2006/0261890 A1 | | 11/2006 | Floyd et al. |
| 2006/0281431 A1 | | 12/2006 | Isaac et al. |
| 2007/0161361 A1 | | 7/2007 | Vaisanen et al. |
| 2008/0096516 A1 | | 4/2008 | Mun et al. |
| 2008/0122560 A1 | | 5/2008 | Liu |
| 2009/0309661 A1 | * | 12/2009 | Chang .................. H03F 1/0272 |
| | | | 330/285 |
| 2010/0013562 A1 | * | 1/2010 | Stockinger ............ H03F 1/3205 |
| | | | 330/301 |
| 2011/0103494 A1 | | 5/2011 | Ahmadi |
| 2011/0163824 A1 | | 7/2011 | Kawano |
| 2011/0241163 A1 | | 10/2011 | Liu et al. |
| 2012/0081192 A1 | | 4/2012 | Hanaoka |
| 2012/0249266 A1 | | 10/2012 | Lim et al. |
| 2012/0262252 A1 | | 10/2012 | Tseng et al. |
| 2013/0049902 A1 | | 2/2013 | Hendry et al. |
| 2013/0244591 A1 | | 9/2013 | Weissman et al. |
| 2013/0295863 A1 | | 11/2013 | Shanan |
| 2014/0133189 A1 | | 5/2014 | Worek |
| 2014/0328220 A1 | | 11/2014 | Khlat et al. |
| 2015/0054582 A1 | | 2/2015 | Goss |

OTHER PUBLICATIONS

Brounley, Richard W., "Matching Networks for Power Amplifiers Operating into High VSWR Loads," High Frequency Electronics, May 2004, pp. 58-62.

Charles, C.T., "A Calibrated Phase and Amplitude Control System for a 1.9 GHz Phased-Array Transmitter Element," IEEE Transactions on Circuits and Systems 1: Regular Papers, vol. 56, No. 12, Dec. 2009, pp. 2728-2737.

Chen, Wei, et al., "A Novel VSWR-Protected and Controllable CMOS Class E Power Amplifier for Bluetooth Applications," International Journal of Design, Analysis and Tools for Circuits and Systems, vol. 1, No. 1, Jun. 2011, pp. 22-26.

D'Andrea, Aldo N., et al., "RF Power Amplifier Linearization through Amplitude and Phase Predistortion," IEEE Transactions on Communications, vol. 44, No. 11, Nov. 1996, pp. 1477-1484.

Dawson, J., et al., "Automatic Phase Alignment for a Fully Integrated Cartesian Feedback Power Amplifier System," IEEE Journal of Solid-State Circuits, vol. 38, No. 12, Dec. 2003, pp. 2269-2279.

Dawson, Joel L., "Feedback Linearization of RF Power Amplifiers," Dissertation for Stanford University, Stanford, Calif., Aug. 2003, 191 pages.

Delaunay, Nicolas, et al., "Linearization of a 65nm CMOS Power Amplifier with a Cartesian Feedback for W-CDMA Standard," Joint IEEE North-East Workshop on Circuits and Systems and TAISA Conference, Jun. 28-Jul. 1, 2009, Toulouse, France, 4 pages.

Do, Ji-Noon, et al., "W-CDMA High Power Amplifier Using Anti-Phase Intermodulation Distortion Linearization Technology," Asia-Pacific Microwave Conference, Dec. 11-14, 2007, Bangkok, Thailand, 4 pages.

Hoppenjans, Eric E., et al., "A Vertically Integrated Tunable UHF Filter," 2010 IEEE MTT-S International Microwave Symposium Digest (MTT), May 23-28, 2010, Anaheim, Calif., pp. 1380-1383.

(56) References Cited

OTHER PUBLICATIONS

Hu, Q.Z., et al., "A SiGe Power Amplifier with Power Detector and VSWR Protection for TD-SCDMA Application," Proceedings of the International Conference on Mixed Design of Integrated Circuits and Systems, Jun. 22-24, 2006, Gdynia, Poland, pp. 214-217.
Hur, J., et al., "An Amplitude and Phase Mismatches Calibration Technique for the LINC Transmitter with Unbalanced Phase Control," IEEE Transactions on Vehicular Technology, vol. 60, No. 9, Nov. 2011, pp. 4184-4193.
Idris, D., et al., "Design and Implementation of Self-Calibration for Digital Predistortion of Power Amplifiers," WSEAS Transactions on Circuits and Systems, vol. 7, No. 2, Feb. 2008, pp. 75-84.
Keerti, Arvind, et al., "RF Characterization of SiGe HBT Power Amplifiers under Load Mismatch," IEEE Transactions on Microwave Theory and Techniques, vol. 55, No. 2, Feb. 2007, pp. 207-214.
Kim, Jangheon et al., "Analysis of Adaptive Digital Feedback Linearization Techniques," IEEE Transactions on Circuits and Systems—1: Regular Papers, vol. 57, No. 2, Feb. 2010, pp. 345-354.
Ko, Sangwon, et al., "A Linearized Cascode CMOS Power Amplifier," IEEE Annual Wireless and Microwave Technology Conference, WAMICON '06, Dec. 4-6, 2006, Clearwater Beach, Florida, 4 pages.
Liu, Jenny Yi-Chun, et al., "Millimeter-Wave Self-Healing Power Amplifier with Adaptive Amplitude and Phase Linearization in 65-nm CMOS," IEEE Transactions on Microwave Theory and Techniques, vol. 60, No. 5, May 2012, pp. 1342-1352.
Mu, Xiaofang, et al., "Analysis of Output Power Variation under Mismatched Load in Power Amplifier FEM with Directional Coupler," IEEE MTT-S International Microwave Symposium Digest, Jun. 7-12, 2009, Boston, Mass., pp. 549-552.
Nakayama, Masatoshi, et al., "A Novel Amplitude and Phase Linearizing Technique for Microwave Power Amplifiers," IEEE MTT-S International Microwave Symposium Digest, vol. 3, May 16-20, 1995, Orlando, Fla., pp. 1451-1454.
Peng, Zhan, et al., "RF Power Amplifier Linearization Method Based on Quadrature Nonlinear Model," 1st International Conference on Information Science and Engineering, Dec. 26-28, 2009, Nanjing, China, pp. 2711-2713.
Rachakonda, Anil, et al., "Log Amps and Directional Couplers Enable VSWR Detection," RF Design Magazine, Jan. 2007, pp. 28-34.
Scuderi, Antonino, et al., "A VSWR-Rugged Silicon Bipolar RF Power Amplifier," Proceedings of the Bipolar/BiCMOS Circuits and Technology Meeting, Oct. 9-11, 2005, pp. 116-119.
So, Jinhyun, et al., "Digital Predistortion Based on Envelope Feedback," IEEE International Conference on Acoustics, Speech and Signal Processing (ICASSP), Mar. 25-30, Kyoto, Japan, pp. 3169-3172.
Woo, Wangmyong, et al., "A New Envelope Predistortion Linearization Architecture for Handset Power Amplifiers," IEEE Radio and Wireless Conference, Sep. 19-22, 2004, pp. 175-178.
Zhang, X., et al., "Gain/Phase Imbalance-Minimization Techniques for LINC Transmitters," IEEE Transactions on Microwave Theory and Techniques, vol. 49, No. 12, Dec. 2001, pp. 2507-2516.
International Search Report and Written Opinion for PCT/US2014/030431, mailed Jun. 20, 2014, 14 pages.
Notice of Allowance for U.S. Appl. No. 14/215,815, mailed Oct. 1, 2015, 7 pages.
Non-Final Office Action for U.S. Appl. No. 14/215,800, mailed Nov. 20, 2015, 5 pages.
Final Office Action for U.S. Appl. No. 14/217,199, mailed Oct. 19, 2015, 5 pages.
International Preliminary Report on Patentability for PCT/US2014/030431, mailed Sep. 24, 2015, 10 pages.
Non-Final Office Action for U.S. Appl. No. 14/218,953, mailed Jul. 24, 2015, 10 pages.
Notice of Allowance for U.S. Appl. No. 14/218,953, mailed May 2, 2016, 5 pages.
Notice of Allowance for U.S. Appl. No. 14/555,053, mailed Apr. 19, 2016, 7 pages.
Notice of Allowance for U.S. Appl. No. 14/216,794, mailed Nov. 24, 2015, 7 pages.
Final Office Action for U.S. Appl. No. 14/218,953, mailed Jan. 4, 2016, 11 pages.
Non-Final Office Action for U.S. Appl. No. 14/555,053, mailed Dec. 31, 2015, 5 pages.
Notice of Allowance for U.S. Appl. No. 14/216,376, mailed Feb. 22, 2016, 10 pages.
Final Office Action for U.S. Appl. No. 14/215,800, mailed Mar. 11, 2016, 6 pages.
Non-Final Office Action for U.S. Appl. No. 14/217,199, mailed Feb. 4, 2016, 5 pages.
Final Office Action for U.S. Appl. No. 14/555,557, mailed Sep. 20, 2016, 23 pages.
Non-Final Office Action for U.S. Appl. No. 14/216,794, mailed Jun. 30, 2015, 5 pages.
Non-Final Office Action for U.S. Appl. No. 14/215,815, mailed May 4, 2015, 13 pages.
Non-Final Office Action for U.S. Appl. No. 14/216,376, mailed May 7, 2015, 8 pages.
Non-Final Office Action for U.S. Appl. No. 14/217,199, mailed Jul. 2, 2015, 6 pages.
Final Office Action for U.S. Appl. No. 14/217,199, mailed Jul. 7, 2016, 5 pages.
Non-Final Office Action for U.S. Appl. No. 14/555,557, mailed Jun. 13, 2016, 28 pages.
Non-Final Office Action for U.S. Appl. No. 14/215,800, mailed Aug. 11, 2016, 6 pages.
Advisory Action for U.S. Appl. No. 14/217,199, mailed Oct. 17, 2016, 2 pages.
Non-Final Office Action for U.S. Appl. No. 14/217,199, mailed Nov. 23, 2016, 6 pages.
Final Office Action for U.S. Appl. No. 14/215,800, dated Feb. 8, 2017, 7 pages.
Non-Final Office Action for U.S. Appl. No. 14/555,557, dated Feb. 13, 2017, 21 pages.
Advisory Action for U.S. Appl. No. 14/215,800, dated Apr. 20, 2017, 2 pages.
Notice of Allowance for U.S. Appl. No. 14/217,199, dated Apr. 4, 2017, 6 pages.

* cited by examiner

CONVENTIONAL COMMUNICATION CIRCUIT WITH POWER COUPLER

BLOCK DIAGRAM

BIAS SWITCH POSITION
FOR SMALL Vin

RF REPLICATOR FOR ACCURATE MODULATED AMPLITUDE AND PHASE MEASUREMENT

RELATED APPLICATIONS

The present application claims the benefit of and priority to U.S. Provisional Patent Application No. 61/793,583, filed Mar. 15, 2013; U.S. Provisional Patent Application No. 61/789,508, filed Mar. 15, 2013; U.S. Provisional Patent Application No. 61/800,772, filed Mar. 15, 2013; U.S. Provisional Patent Application No. 61/800,991, filed Mar. 15, 2013; U.S. Provisional Patent Application No. 61/801,038, filed Mar. 15, 2013; U.S. Provisional Patent Application No. 61/946,270, filed Feb. 28, 2014; and U.S. Provisional Patent Application No. 61/946,927, filed Mar. 3, 2014.

The present application is related to concurrently filed U.S. patent application Ser. No. 14/215,815, now U.S. Pat. No. 9,294,045, entitled "GAIN AND PHASE CALIBRATION FOR CLOSED LOOP FEEDBACK LINEARIZED AMPLIFIERS"; U.S. patent application Ser. No. 14/217,199, entitled "POWER AMPLIFIER WITH WIDE DYNAMIC RANGE AM FEEDBACK LINEARIZATION SCHEME"; U.S. patent application Ser. No. 14/216,794, now U.S. Pat. No. 9,294,046, entitled "RF POWER AMPLIFIER WITH PM FEEDBACK LINEARIZATION"; U.S. patent application Ser. No. 14/215,800, entitled "WEAKLY COUPLED BASED HARMONIC REJECTION FILTER FOR FEEDBACK LINEARIZATION POWER AMPLIFIER"; U.S. patent application Ser. No. 14/218,953, now U.S. Pat. No. 9,444,411, entitled "RF POWER AMPLIFIER WITH TOTAL RADIATED POWER STABILIZATION"; and U.S. patent application Ser. No. 14/216,376, now U.S. Pat. No. 9,391,565, entitled "AMPLIFIER PHASE DISTORTION CORRECTION BASED ON AMPLITUDE DISTORTION MEASUREMENT".

All of the applications listed above are hereby incorporated herein by reference in their entireties.

FIELD OF THE DISCLOSURE

The field of disclosure is communication circuits including an amplification circuit, a replicator circuit, and a correction circuit. Specifically, the replicator circuit emulates the amplification circuit.

BACKGROUND

FIG. 5 illustrates a conventional communication circuit 160 using a power coupler 172 to measure the power of an amplified signal 170. This conventional communication circuit 160 measures transmitted power in the presence of load mismatch (VSWR, or Voltage Standing Wave Ratio), but has several major drawbacks including: large area, large cost, and introduction of significant insertion loss and efficiency degradation because a fraction of the amplified signal is diverted to a sensed signal through the power coupler.

Specifically, input node 162 sends input signal 164 to amplification circuit 166. Amplification circuit 166 includes at least one amplifier 168, and also sends amplified signal 170 to power coupler 172.

Power coupler 172 effectively splits amplified signal 170 into output signal 174 and sensed signal 178. Output signal 174 is sent towards output node 176. Sensed signal 178 draws a substantial amount of power from amplified signal 170, effectively attenuating amplified signal 170 to generate output signal 174. In other words, the power of output signal 174 plus sensed signal 178 approximately equals the power of amplified signal 170.

Sensed signal 178 is sent towards correction circuit 180. Correction circuit 180 may perform signal processing, and may send control signal 182 towards amplification circuit 166. Thus, correction circuit 180 forms a feedback loop, although not necessarily a classic feedback loop. Classic feedback is defined as measuring an output of a system, comparing the output to a reference (such as an input signal), generating an error signal based upon the comparison, and then controlling the system based upon the error signal.

Conventional communication circuit 160 suffers from many additional problems. First, a substantial amount of power is drawn by away by sensed signal 178.

Second, sensed signal 178 is sensitive to distortions caused by, for example, parasitic coupling to output node 176 which in many cases is a relatively large trace that travels on the module board alongside of the signals before going to correction circuit 180.

Third, amplified signal 170 is a high power signal, and therefore power coupler 172 must have a very high linearity in order to handle high power. Furthermore, in order to operate properly the power couplers need to have their size a significant fraction of the processed signal wavelength. This results in very large sizes for the power couplers when the processed signals have low frequencies (large wavelengths).

In conventional circuits, sensing an amplified signal is difficult due to large load mismatches that vary slowly in time (VSWR). These load variations result in wide variations in the amplified signal, and these wide variations are costly to correct.

The total output phase from an amplified signal may be separated into two components: a quasi-static component and a dynamic component. The quasi-static (slowly varying) component is a function of the VSWR load, but is constant with respect to power. In other words, the quasi-static component remains constant for a given load, even if the power increases.

In contrast, the dynamic component varies strongly as a function of power. Thus, linearizing the response of a power amplifier circuit generally only requires compensating for the dynamic component, in order to correct for the dynamic phase variation. However, if the quasi-static and dynamic components are not separated, then a very wide range is required from the correction circuit, which results in the correction circuit having large area, high cost, and high power dissipation.

SUMMARY

To overcome the drawbacks of using a power coupler to measure the power of an amplified signal, it is desirable to use a replicator circuit to generate a replicated signal that approximately equals an amplified signal from the amplification circuit. A voltage matching circuit may be used to provide a matched signal to the replicator circuit. The signal processed by the replicator may be a current, or a voltage, or a combination of current and voltage.

In one embodiment, a communication circuit includes an amplification circuit configured to receive an input signal (and configured to generate a sensed signal and an amplified signal), a replicator circuit configured to receive the sensed signal from the amplification circuit (and configured to generate a replicated signal approximately equal to the amplified signal), and a correction circuit configured to receive the replicated signal. The correction circuit is also configured to generate a control signal, and configured to send the control signal to the amplification circuit such that the replicator circuit and the correction circuit form a control loop or a control path.

In one embodiment, a communication circuit further includes a voltage matching circuit including a switching circuit configured to pass a first bias voltage from the amplification circuit to the replicator circuit when an input voltage to the amplification circuit is high, and a correction circuit.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

Figure 5:
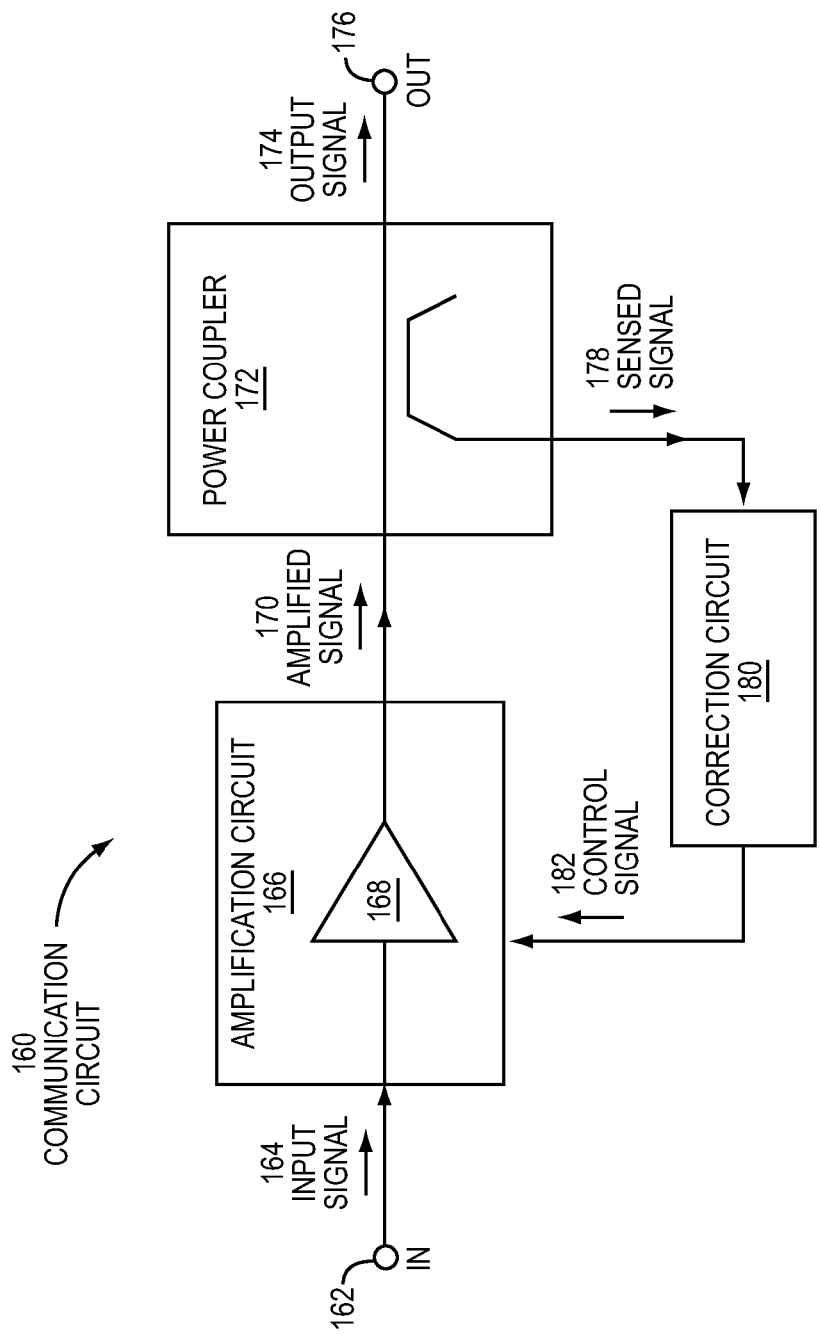

FIG. 5 illustrates a conventional communication circuit 160 using a power coupler 172 to measure the power of an amplified signal 170.

Figure 6A:
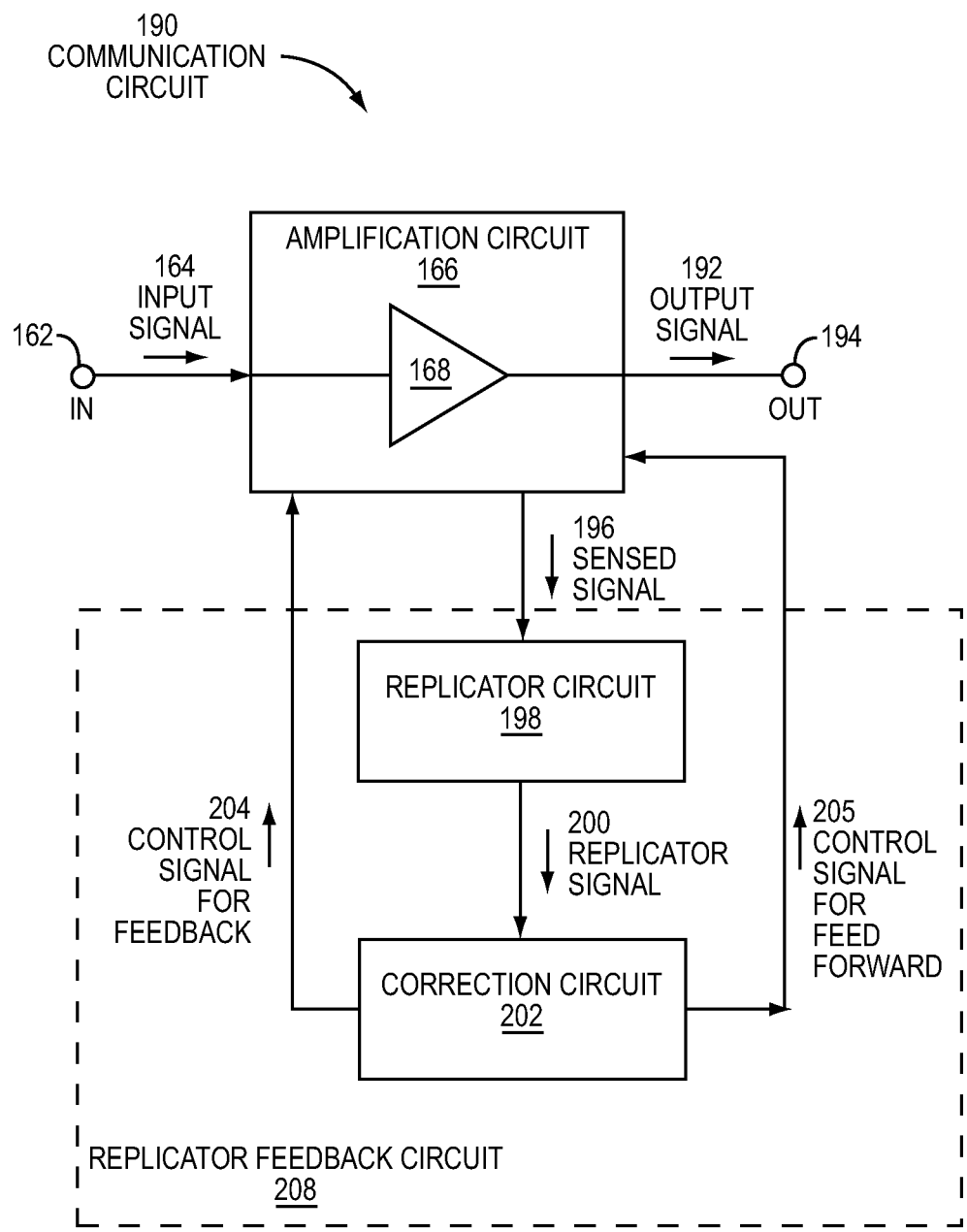

FIG. 6A illustrates a communication circuit 190 including a replicator circuit 198.

Figure 6B:
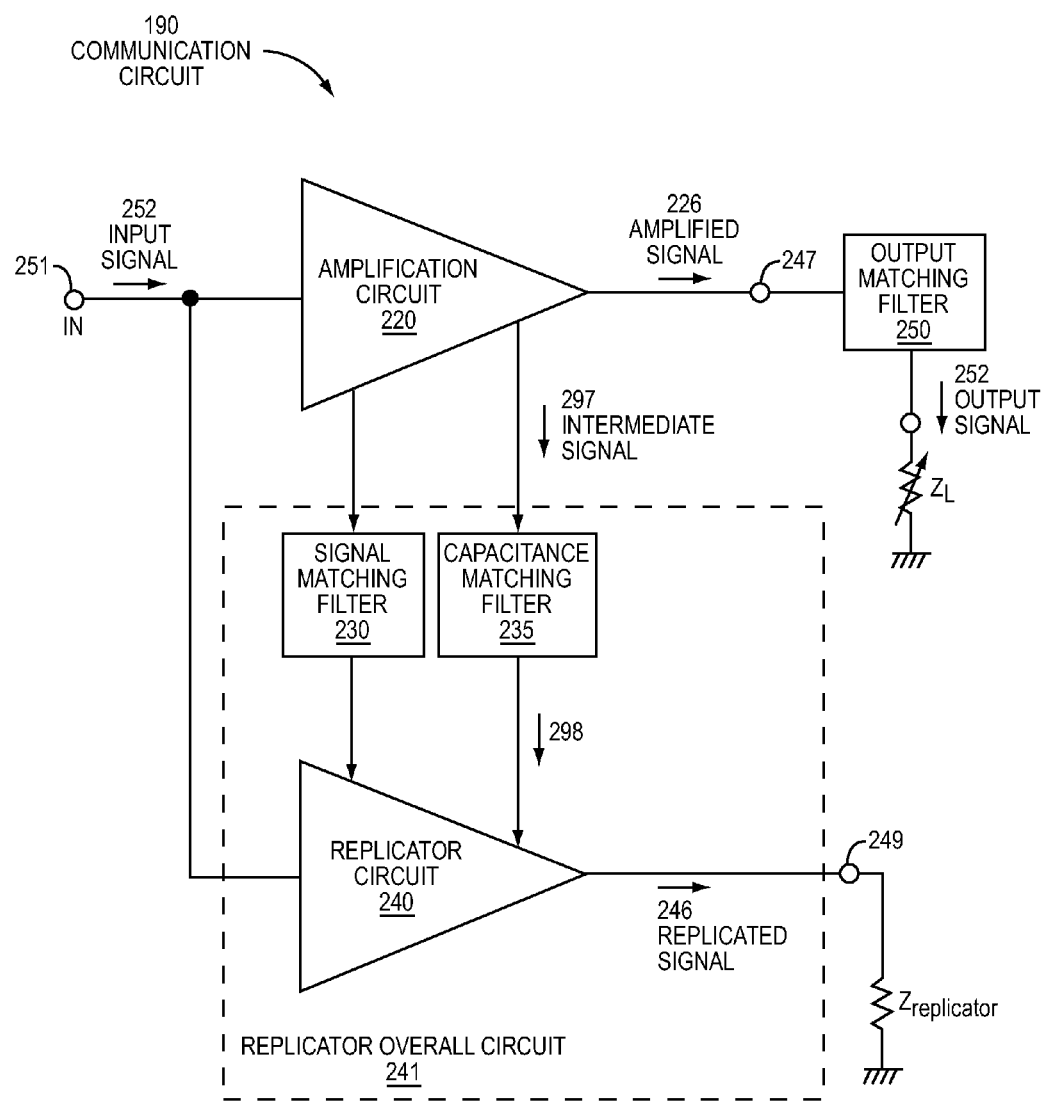

FIG. 6B illustrates a communication circuit 195 including a replicator overall circuit 241.

Figure 6C:
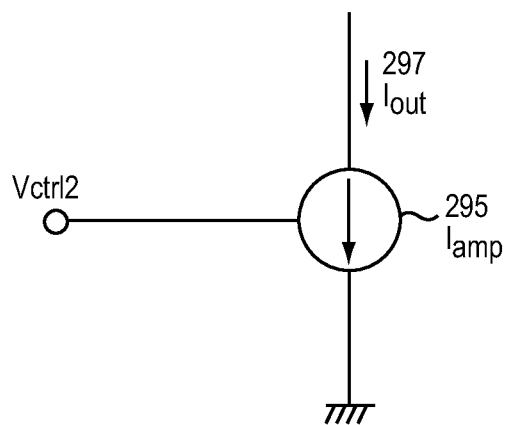
Figure 6C:
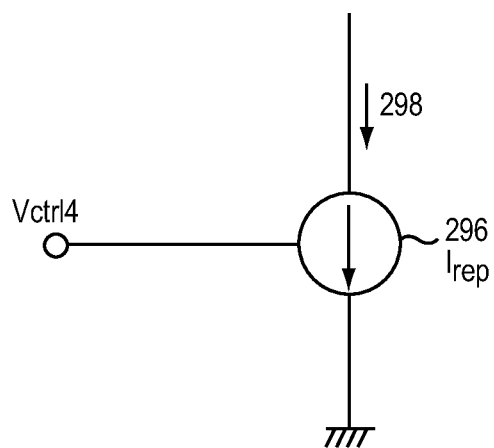

FIG. 6C illustrates current source models.

Figure 7:
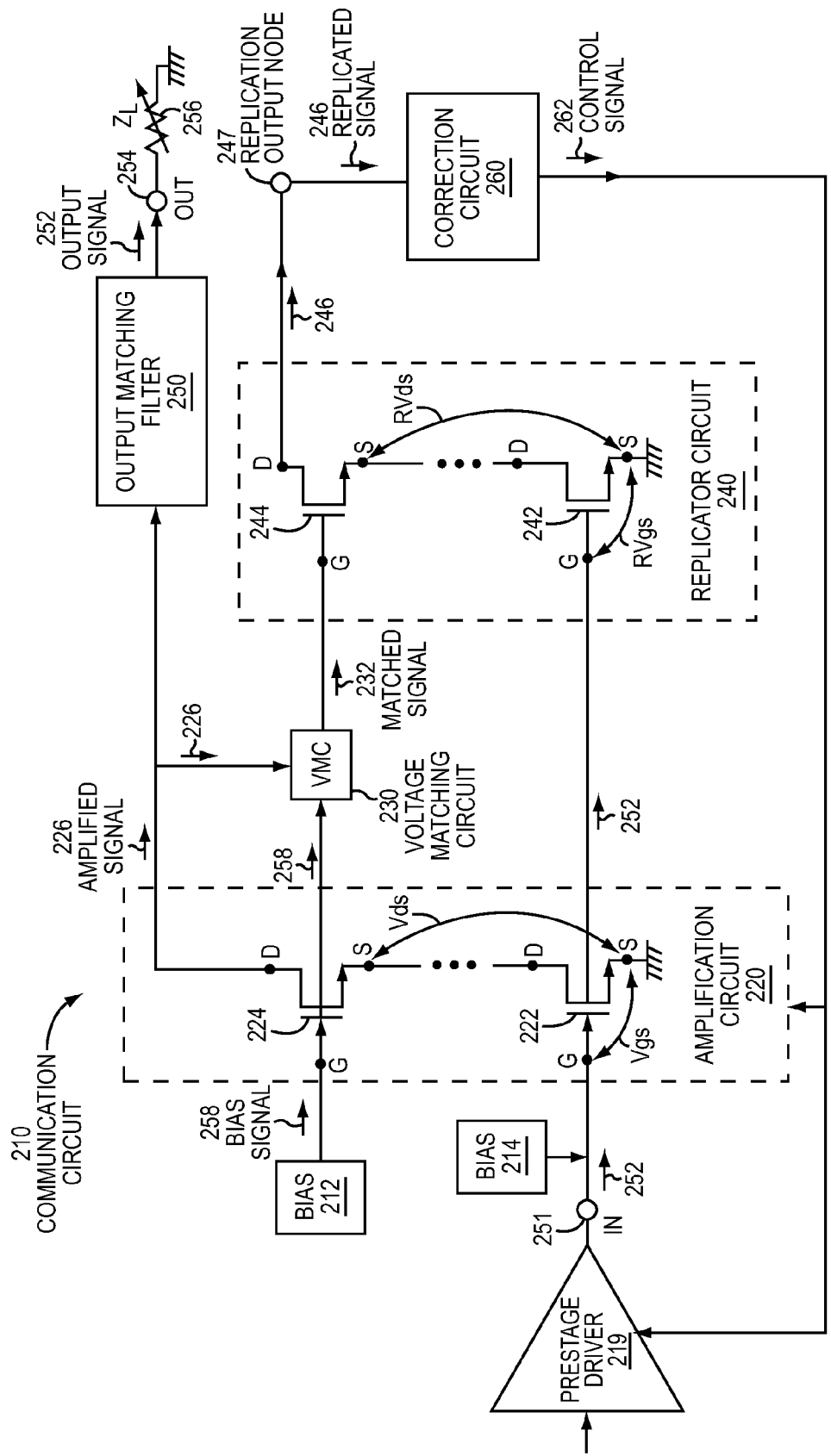

FIG. 7 is a communication circuit 210 including: bias circuit 212, optional bias circuit 214, amplification circuit 220 (including transistor 222 and transistor 224), replicator circuit 240 (including transistor 242 and transistor 244), and output matching circuit 250.

Figure 8:
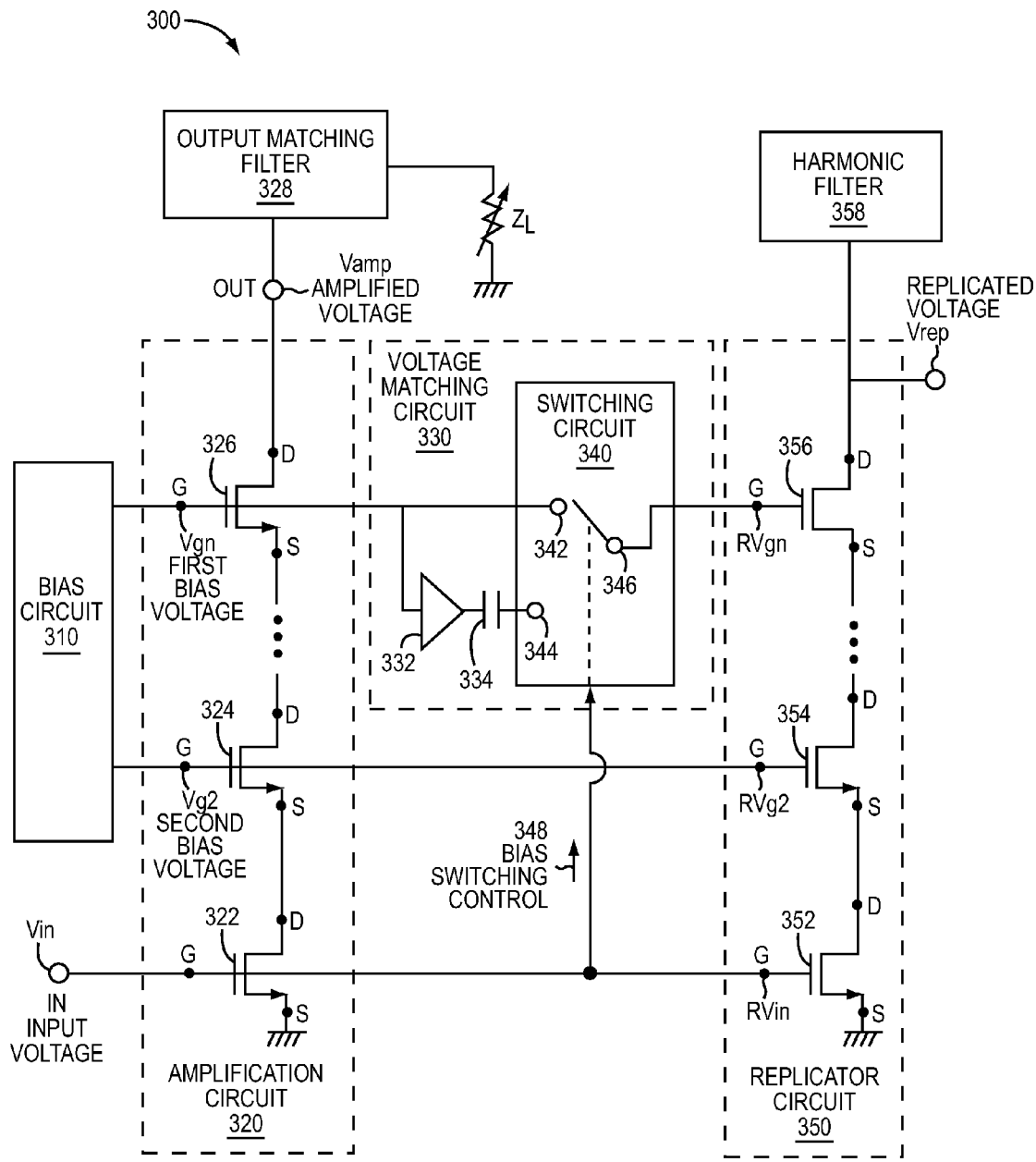

FIG. 8 illustrates a communication circuit 300 including a bias switching circuit 340 and a replicator 350.

Figure 9:
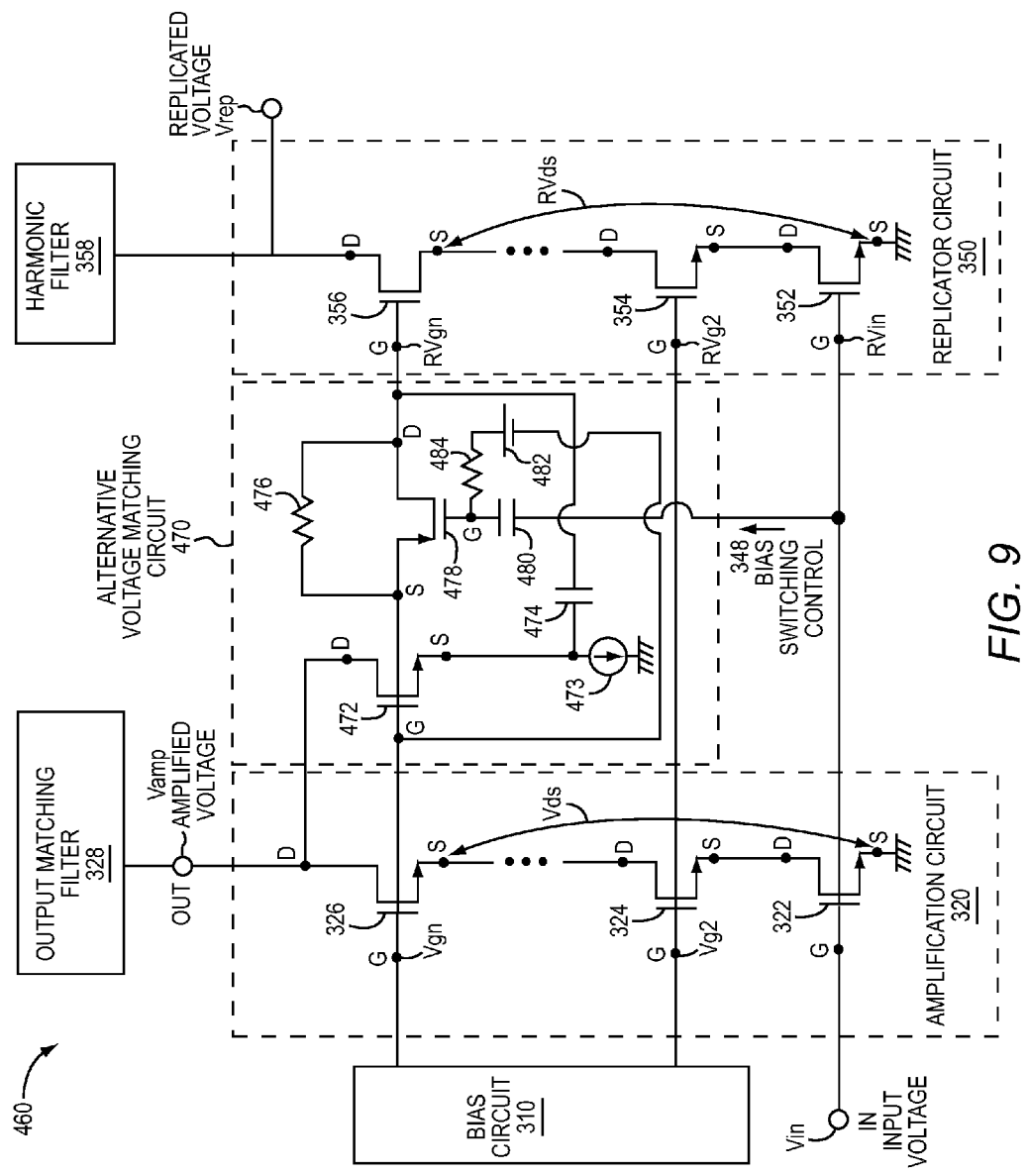

FIG. 9 illustrates an alternative voltage matching circuit 460.

Figure 10:
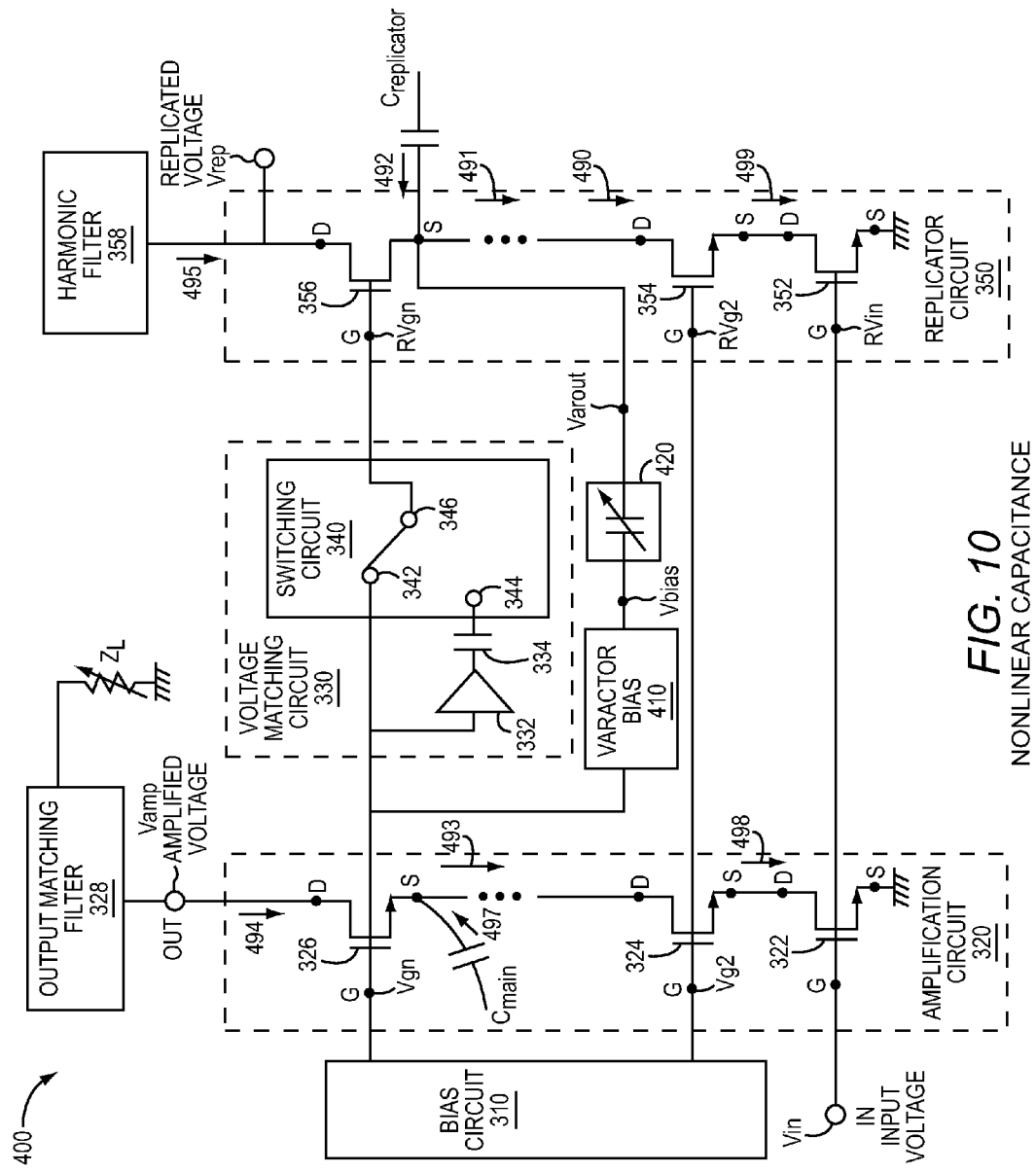

FIG. 10 illustrates a communication circuit 400 including nonlinear capacitance.

Figure 11:
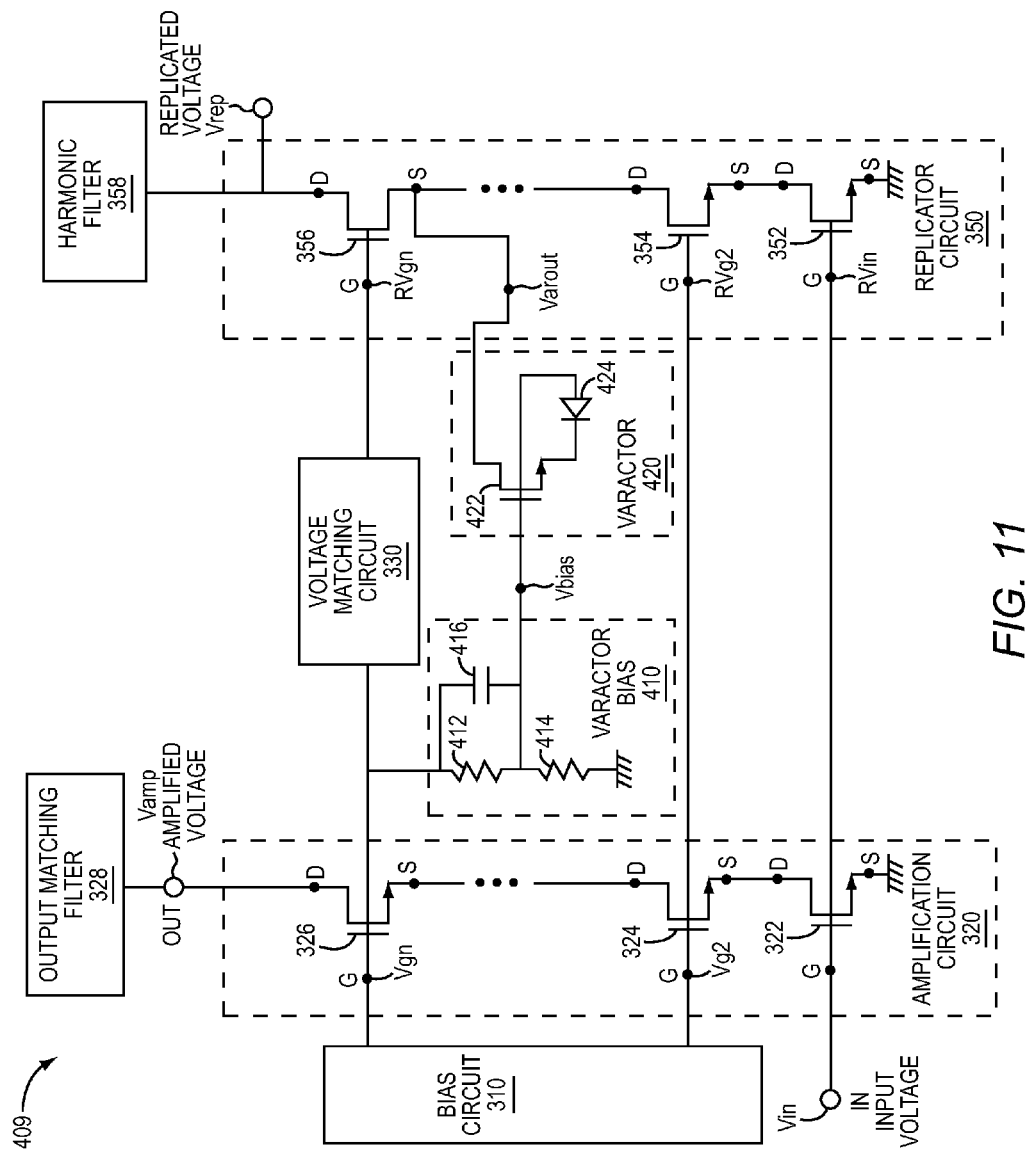

FIG. 11 illustrates a communication circuit 409 and provides details for varactor bias circuit 410 and details for varactor 420.

Figure 12:
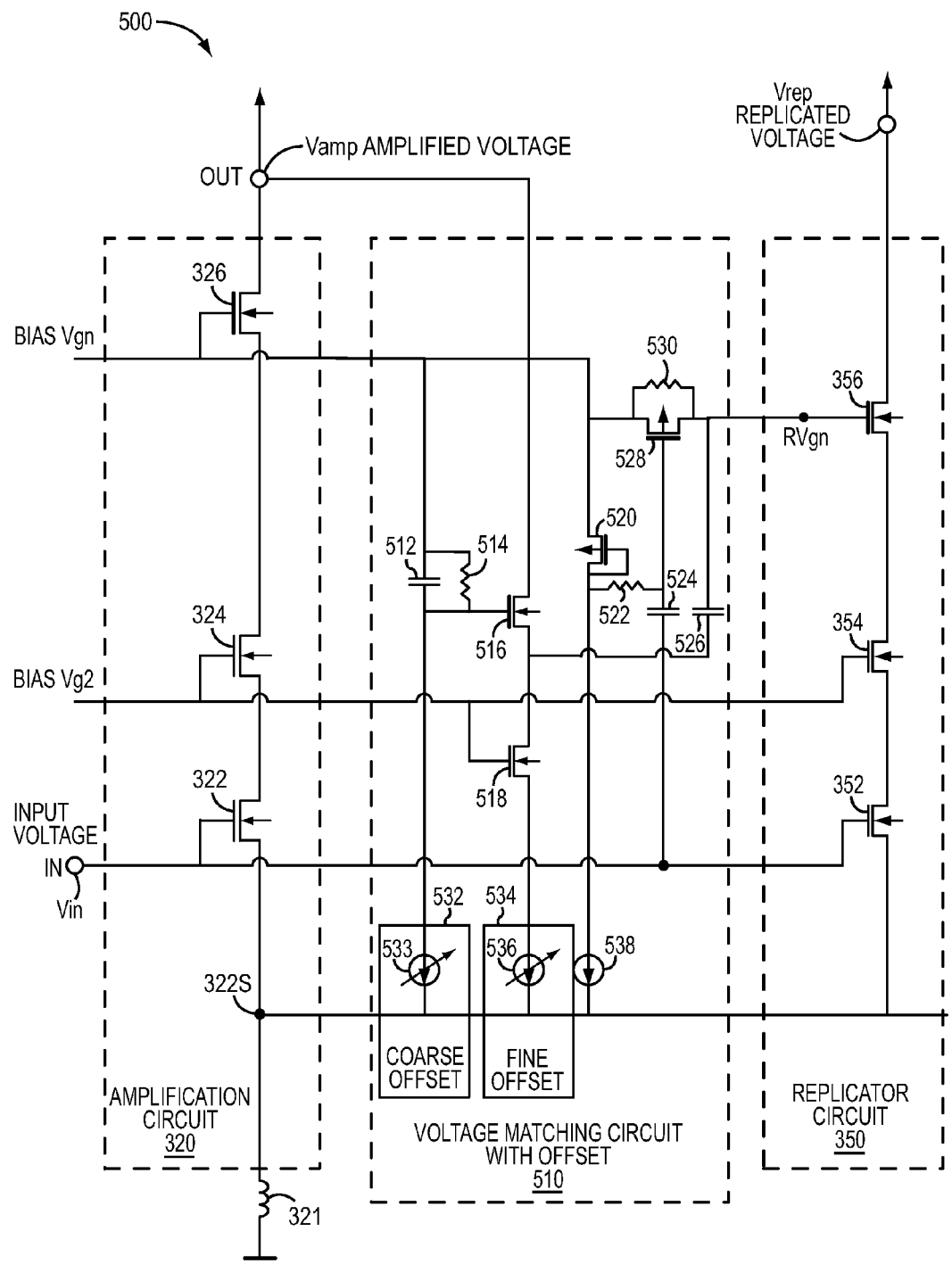

FIG. 12 illustrates a communication circuit 500 including a voltage matching circuit with offset 510.

Figure 13:
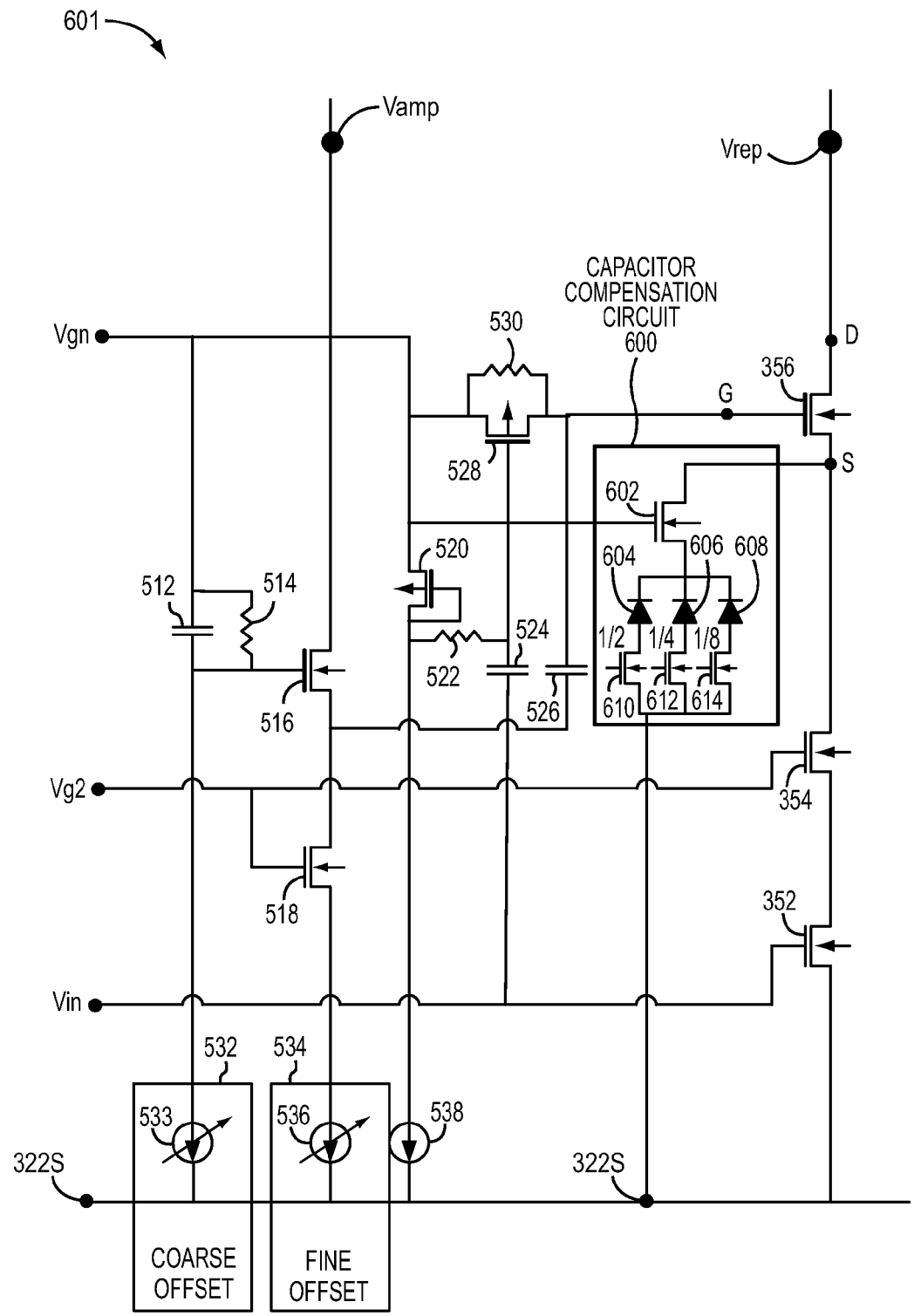
Figure 14:
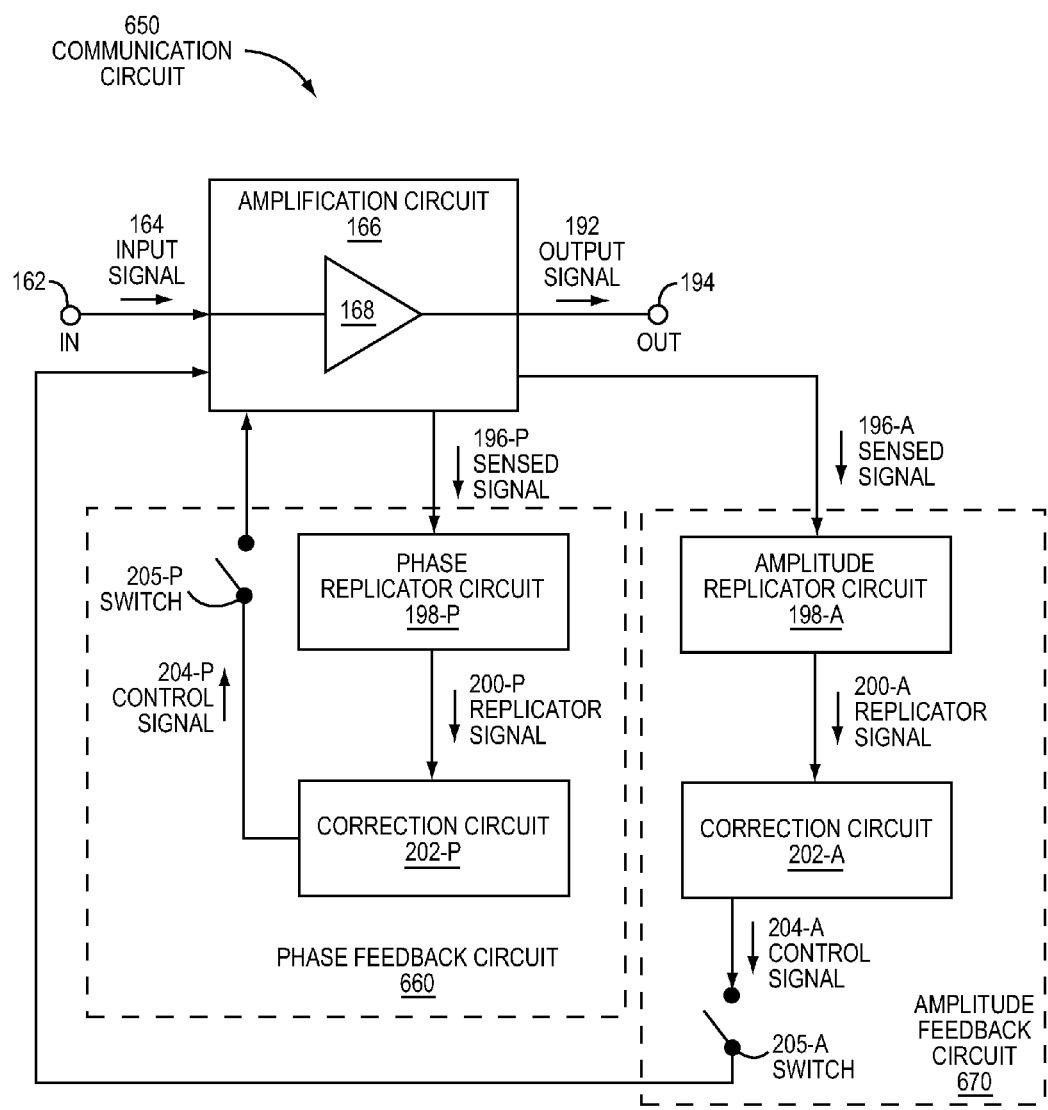

FIG. 13 illustrates a capacitor compensation circuit 600 inserted inside of a portion of voltage matching circuit with offset 510 in order to improve accuracy FIG. 14 illustrates communication circuit 650 including phase feedback circuit 660 and amplitude feedback circuit 670.

Figure 15:
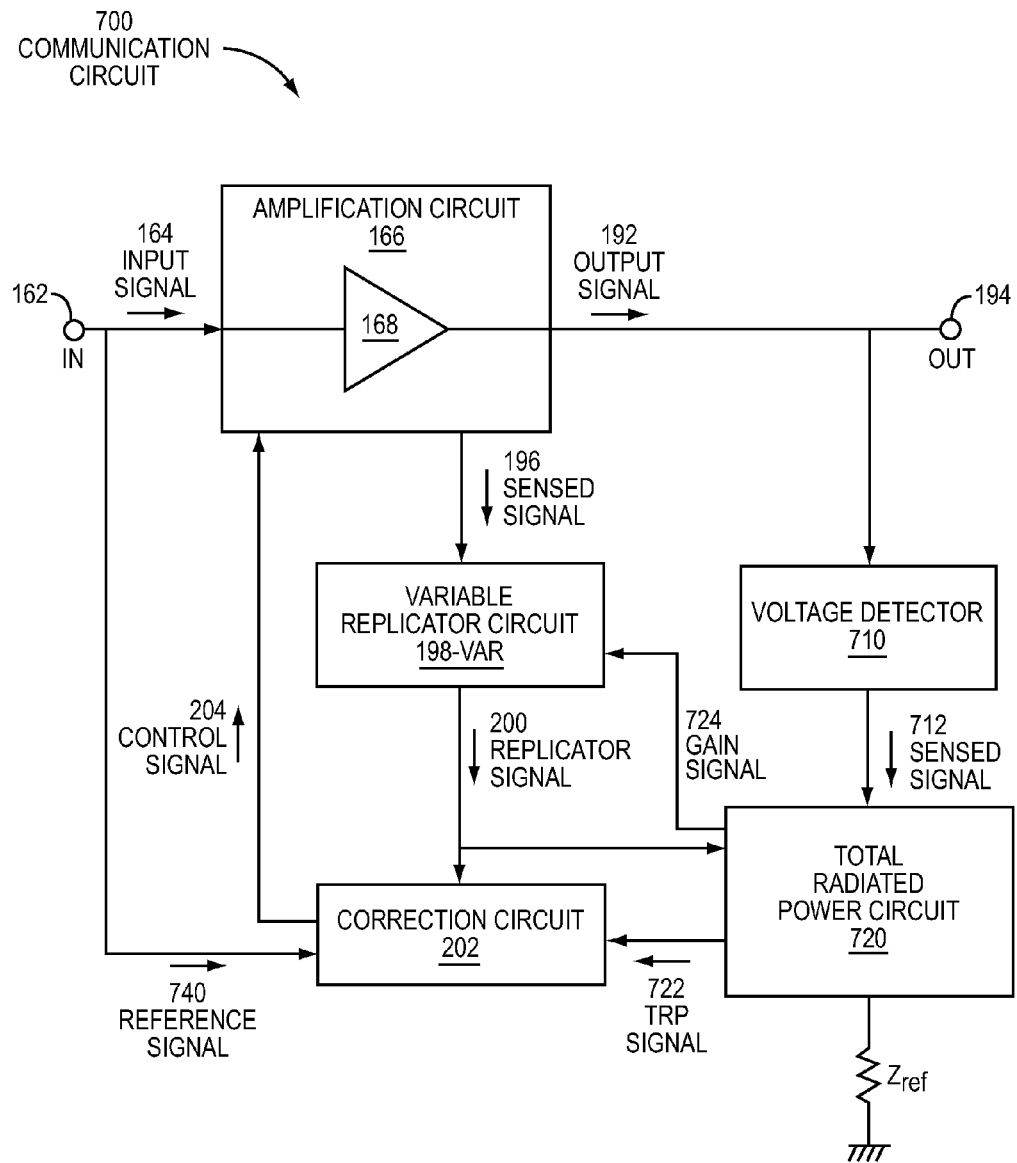

FIG. 15 illustrates communication circuit 700 including variable replicator circuit 198-VAR.

DETAILED DESCRIPTION

The embodiments set forth below represent the necessary information to enable those skilled in the art to practice the disclosure and illustrate the best mode of practicing the disclosure. Upon reading the following description in light of the accompanying drawings, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

With regard to the term "terminus," terminus refers to any conductive feature in an electronic component for receiving signals, transmitting signals, and/or establishing a connection to another electronic component. For instance, a terminus may be one or more nodes, ports, conductive pads, pins, solder bumps, terminals, leads, pins, and/or the like. To provide an example with regard to receiving and/or transmitting a single-ended signal, a terminus may be provided as a single terminal utilized to receive and/or transmit the single-ended signal. However, to be clear, this disclosure is not in any way limited to single-ended signals. Thus, to provide an example with regard to differential signals, a terminus may be provided as a pair of terminals for receiving and/or transmitting a positive and negative side of the differential signal.

With regard to the term "endogenous," endogenous refers to a signal, parameter, or action being derived and/or originating internally within an electronic component. For example, a set point for a closed-loop circuit is established endogenously by the closed-loop circuit, if the set point is derived and/or originates internally within the closed-loop circuit. In contrast, with regard to the term "exogenous," exogenous refers to a signal, parameter, or action being derived and/or originating externally from the electronic component. For example, the set point for a closed-loop circuit is established endogenously with respect to the closed-loop circuit, if the set point is derived and/or originates in external control circuitry outside of the closed-loop circuit.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

This disclosure relates to (radio frequency) RF communication systems for transmitting and/or receiving RF signals. In particular, this disclosure relates to RF amplification devices and methods for amplifying RF signals. As such, embodiments of exemplary RF amplification devices are described herein to comprehensively explain various innovative concepts and techniques related to the disclosure. In order to help describe these innovative concepts and techniques, the exemplary RF amplification devices disclosed herein include examples of exemplary circuits and circuit elements. To further elucidate these innovative concepts and techniques, the exemplary RF amplification devices are sometimes described as being employed within certain types of RF communication systems. It should be noted that the scope of this disclosure is not limited to the exemplary RF amplification device, circuits, circuit components, and RF communication systems specifically described herein. Rather, the scope of this disclosure extends to any and all systems, devices, circuits, circuit components and methods (whether described explicitly or implicitly) in accord with the innovative concepts and techniques described in this disclosure.

The innovative concepts and techniques described in this disclosure described herein can be used to amplify an RF signal with high power efficiency and/or by introducing low distortion. While not required, the exemplary RF amplification devices may thus be used to amplify RF signals provided within various RF communication bands and/or formatted in accordance with various RF communication standards in order to allow for wide-band amplification operations. However, the exemplary RF amplification devices described may implement to operate with increased autonomy and thus provide wide-band amplification operations with less or no support from other components within the RF communication system. The exemplary RF amplification devices can thus be easily provided within the RF communication system without requiring major customization and/or coordination with other system devices.

Figure 1:
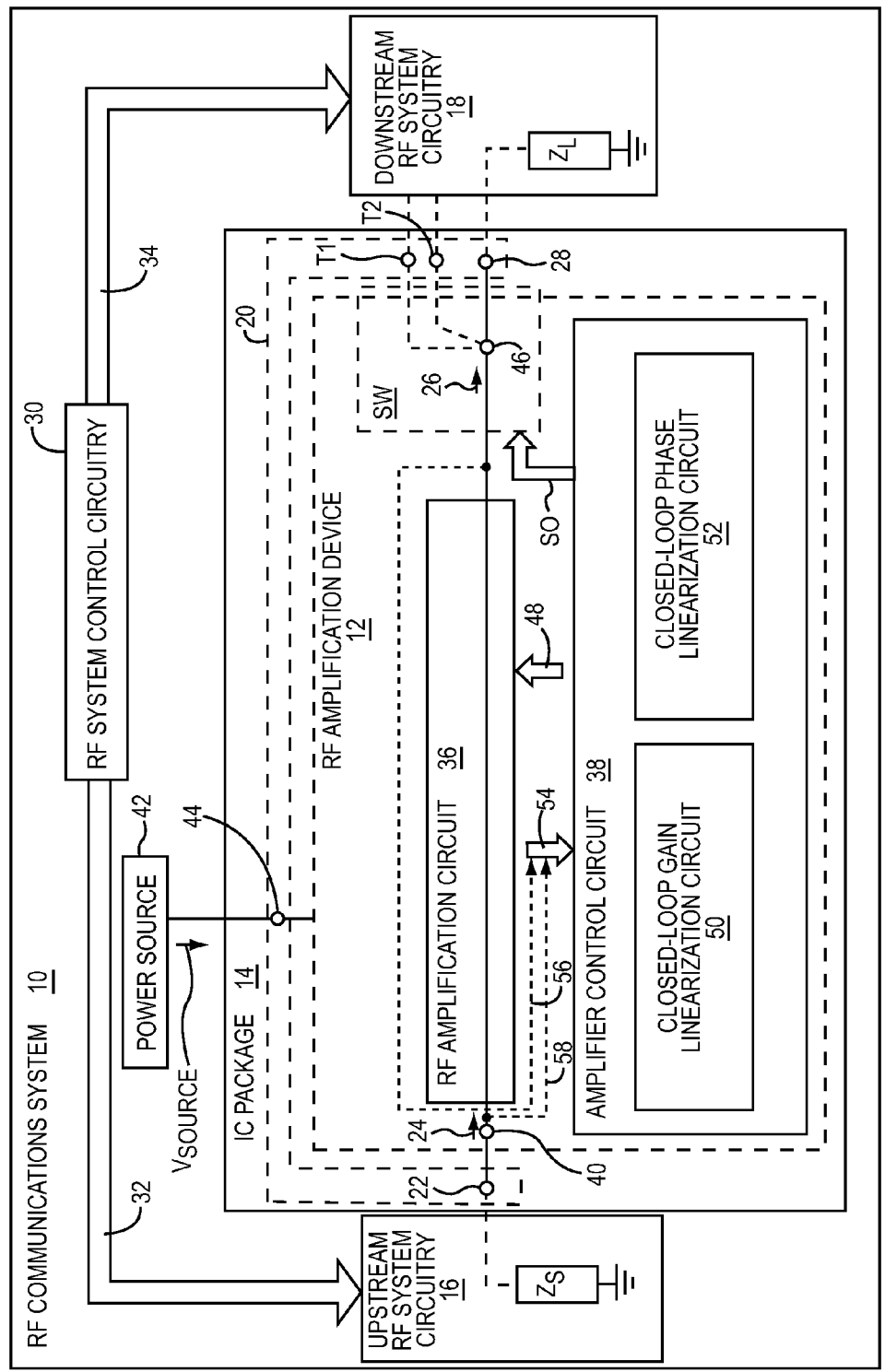
FIG. 1 illustrates a block diagram of an exemplary radio frequency (RF) communications system that includes an exemplary RF amplification device integrated into an exemplary integrated circuit (IC) package.

FIG. 1 illustrates a block diagram of one embodiment of an RF communications system 10. The RF communications system 10 may be any type of communication system capable of transmitting and/or receiving wireless communications signals. For example, the RF communications system 10 may be provided as an RF front-end module in a portable computing device (i.e., cellular phone, tablet, laptop) configured to transmit and/or receive information on one or more wireless communication networks. The RF communications system 10 may include one or more antennas and various transceiver chains (i.e., receiver chains and/or transmit chains) that process RF signals within different communication bands, formatted in accordance with different RF communication standards, and/or in accordance with different RF communication specifications for these RF communication standards.

In FIG. 1, the RF communications system 10 includes an exemplary RF amplification device 12 provided in an integrated circuit (IC) package 14. The RF amplification device 12 is coupled between upstream RF system circuitry 16 and downstream RF system circuitry 18 within the RF communications system 10. For example, the upstream RF system circuitry 16, the RF amplification device 12, and downstream RF system circuitry 18 may be or may be part of either one or more transmit chains or one or more receive chains within the RF communications system 10. The IC package 14 houses the RF amplification device 12 and allows the RF amplification device 12 to transmit and receive signals within the RF communications system 10 and external to the IC package 14. More specifically, the IC package 14 includes a package interface 20 configured to connect the RF amplification device 12 to external circuitry within the RF communications system 10. It should be noted that embodiments of the RF amplification device 12 may be provided as discrete component implementations.

As shown in FIG. 1, the package interface 20 includes a first package terminus 22 coupled to the upstream RF system circuitry 16. For example, the RF communications system 10 may be an RF transceiver and the upstream RF system circuitry 16, the RF amplification device 12, and downstream RF system circuitry 18 may be provided so as to form one or more transmit chains of the RF transceiver. As such, the RF communications system 10 may be provided in a user communication device, such as a laptop, a cellular phone, a tablet, a personal computer, or the like. In a transmit chain or in transmit chains, the upstream RF system circuitry 16 may include baseband circuitry and up-conversion circuitry that generates an RF signal 24. As such, the RF signal 24 is exogenous to the IC package 14 and thus the package interface 20 is coupled to the upstream RF system circuitry 16 in order to receive the RF signal 24 when the RF signal 24 is transmitted from the upstream RF system circuitry 16. More specifically, the IC package 14 receives the RF signal 24 at the first package terminus 22. The upstream RF system circuitry 16 thus provides a source of the RF amplification device 12 and presents a source impedance $Z_S$ at the first package terminus 22.

In the transmit chain(s), the RF amplification device 12 is configured to provide amplification prior to transmission by the RF communications system 10 from an antenna. As such, the RF amplification device 12 is configured to provide amplification to the RF signal 24 and generate an amplified RF signal 26. The amplified RF signal 26 is transmitted externally from a second package terminus 28 in the package interface 20 of the IC package 14 to the downstream RF system circuitry 18. A load of the RF amplification device 12 is thus provided by the downstream RF system circuitry 18, which presents a load impedance $Z_L$ at the second package terminus 28. Since this example presumes that the downstream RF system circuitry 18 is part of one or more transmit chains, the downstream RF system circuitry 18 includes the antenna of the RF communications system 10 along with an optional impedance tuner or antenna tuner. The downstream RF system circuitry 18 thus transmits the amplified RF signal 26 to the antenna, which emits the amplified RF signal 26.

The RF amplification device 12 shown in FIG. 1 is operable to operate autonomously and thus can be implemented in the RF communications system 10 without significant customization of the other components in the RF communications system 10. For example, the RF communications system 10 includes RF system control circuitry 30 which are external to the RF amplification device 12 and the IC package 14. The RF system control circuitry 30 is configured to provide control operations to coordinate the operations of the RF communications system 10. For example, the RF system control circuitry 30 may be configured to generate system control outputs 32, 34. A system control output 32 is received by the upstream RF system circuitry 16 in order to regulate its performance. Similarly, a system control output 34 is received by the downstream RF system circuitry 18 in order to regulate its performance. For example, the system control output 34 may tune the antenna tuner within the downstream RF system circuitry 18 and vary the load impedance $Z_L$. However, in this embodiment, the IC package 14, and thus the RF amplification device 12, does not receive a control output from the RF system control circuitry 30. Thus, the RF amplification device 12 can be implemented in the RF communications system 10 with little or no customization of the RF system control circuitry 30.

Alternatively, other embodiments of the IC package 14 and the RF amplification device 12 may receive control outputs from the RF system control circuitry 30 depending on the particular application being implemented. Nevertheless, the features of the RF amplification device 12 shown in FIG. 1 allow for the RF amplification device 12 to operate with more autonomy. Furthermore, the RF amplification device 12 may be designed to have wide-band amplification capabilities. Thus, the RF amplification device 12 is operable to amplify the RF signal 24 while allowing the RF signal 24 to be provided within different RF communication bands, to be formatted in accordance with different RF communication standards, and/or to be provided in accordance with different RF communication specifications within those RF communication standards. Exemplary RF communication standards and specifications include 2G Global System for Mobile Communications (GSM) standard (i.e., a Digital Communication System (DCS) specification, a Personal Communications Service (PCS) specification), GSM specifications, Enhanced Data Rates for GSM Evolution (EDGE) specifications of the 3G standard, Wireless Fidelity (Wi-Fi) Local Area Network (LAN) standards, and/or different specifications of the Long Term Evolution (LTE) standard. Furthermore, the RF signal 24 may be multiplexed in accordance with Time Division Duplex (TDD) techniques, Frequency Division Duplex (FDD) techniques, Space Division Multiplexing (SDM), Code Division Multiple Access Multiplexing (CDMA), Orthogonal Frequency Division Multiple Access Multiplexing (OFDMA), LTE diversity techniques, Multiple-Input and Multiple-Output (MIMO) techniques, and/or the like. The RF amplification device 12 is included in an RF signal path for the RF signal 24. The RF communications system 10 may or may not define additional RF signal paths for different communication bands, specifications, and/or communication standards.

The RF amplification device 12 shown in FIG. 1 includes an RF amplification circuit 36 and an amplifier control circuit 38. Thus, the RF amplification circuit 36 and the amplifier control circuit 38 are provided within the IC package 14. The RF amplification circuit 36 is configured to receive the RF signal 24 from the first package terminus 22 at an input terminus 40. A source voltage $V_{SOURCE}$ is generated by a power source 42 and provided to the RF amplification device 12 at a third package terminus 44 in the package interface 20. The source voltage $V_{SOURCE}$ powers the RF amplification circuit 36 and the amplifier control circuit 38 in the RF amplification device 12.

The RF amplification circuit 36 is configured to amplify the RF signal 24 so as to generate the amplified RF signal 26. In other words, the RF amplification circuit 36 provides amplification to the RF signal 24 by transferring power from the source voltage $V_{SOURCE}$ to the RF signal 24 thereby generating the amplified RF signal 26. The RF amplification circuit 36 then outputs the amplified RF signal 26 after amplification from an output terminus 46 coupled to the second package terminus 28. In this manner, the amplified RF signal 26 is transmitted externally to the downstream RF system circuitry 18.

The RF amplification circuit 36 may be configured to amplify the RF signal 24 when the RF signal 24 is provided in any one of plurality of communication bands and/or is formatted in accordance with any one of a multitude of RF communication standards. Often, the RF amplification circuit 36 is divided into RF amplification stages, including one or more driver RF amplification stages and a final RF amplification stage. Alternatively, the RF amplification circuit 36 may be provided having a single amplification stage. Other circuitry may be provided in the RF amplification circuit 36 in order to provide matching and/or to provide filtering so that undesired signal components (e.g., noise, harmonics) are reduced. The RF amplification circuit 36 is configured to amplify the RF signal 24 so as to generate the amplified RF signal 26 in accordance to a transfer function of the RF amplification circuit 36. Since the transfer function of the RF amplification circuit 36 is defined from input to output, the transfer function of the RF amplification circuit 36 shown in FIG. 1 is from the input terminus 40 to the output terminus 46.

Accordingly, as shown in FIG. 1, since the RF signal 24 may be provided within different RF communication bands, may be formatted in accordance with different RF communication standards, and/or may be provided in accordance with different RF communication specifications within those RF communication standards, the RF amplification device 12 may include an optional multiple-throw switch SW between the RF amplification circuit 36 and the downstream RF system circuitry 18. In this manner, the RF signal 24 may be exogenously transmitted to different antenna/impedance tuners (not shown) and antennas (not shown) in the downstream RF system circuitry 18, which may each be designed for particular or a particular combination RF communication bands, RF communication standards, and/or RF communication specifications. In this case, the output terminus 46 may be a pole port provided in the multiple-throw switch SW. The second package terminus 28 in the package interface 20 may be a throw port of the multiple-throw switch SW. However, the multiple-throw switch SW includes any number of additional throw ports, such as the additional package termini T1, T2 in the package interface 20. The multiple-throw switch SW may be configured to selectively connect the output terminus 46 to any of the package termini T1, T2, 28. In this manner, the multiple-throw switch SW can be used to route the amplified RF signal 26 to the appropriate antenna tuner and the appropriate antenna in the downstream RF system circuitry 18. In one embodiment, the amplifier control circuit 38 is configured to generate a switching output SO to control the multiple-throw switch SW. The multiple-throw switch SW is responsive to the switching output SO so as to selectively connect the output terminus 46 to one of the package termini T1, T2, 28.

With regard to the amplifier control circuit 38, the amplifier control circuit 38 is operably associated with the RF amplification circuit 36 and is configured to control the transfer function of the RF amplification circuit 36. To do this, the amplifier control circuit 38 is configured to generate a control output 48, which may include one or more control signals that may be utilized to control the transfer function of the RF amplification circuit 36. For example, the amplifier control circuit 38 may include biasing circuitry that generates one or more bias signals, RF power converters (i.e., Low-Drop Out Regulators, RF switching converters, charge pumps, the like, or any combination thereof) that generate one or more supply voltages from the source voltage $V_{SOURCE}$ to power the RF amplification circuit 36, phase shifting components, and/or control blocks that generate control signals to adjust characteristic values in the RF amplification circuit 36. As such, the control output 48 generated by the amplifier control circuit 38 may include one or more bias signals, one or more supply voltages, and/or one or more control signals from the control blocks.

As shown in FIG. 1, the amplifier control circuit 38 also includes a closed-loop gain linearization circuit 50 and a closed-loop phase linearization circuit 52. In alternative embodiments, the amplifier control circuit 38 may have or operate only one of the two closed-loop linearization circuits 50, 52. It may also include open-loop linearization circuits. Both the closed-loop gain linearization circuit 50 and the closed-loop phase linearization circuit 52 are configured to increase linearization of a response characteristic defined by the transfer function of the RF amplification circuit 36. More specifically, with regards to the closed-loop gain linearization circuit 50, the response characteristic is a gain defined by the transfer function of the RF amplification circuit 36. Accordingly, the closed-loop gain linearization circuit 50 is configured to increase linearity of the gain of the RF amplification circuit 36. With regards to the closed-loop phase linearization circuit 52, the response characteristic is a phase shift defined by the transfer function of the RF amplification circuit 36. Accordingly, the closed-loop phase linearization circuit 52 is configured to increase linearity of the phase shift of the RF amplification circuit 36. Thus, the closed-loop phase linearization circuit 52 is configured to keep the phase shift of the RF amplification circuit 36 approximately constant. The closed-loop gain linearization circuit 50 and the closed-loop phase linearization circuit 52 provide increase linearity of the gain and the phase shift, respectively, within a communication band of interest of the RF signal 24, which may be a processed modulation signal. In some embodiments, the closed-loop gain linearization circuit 50 and the closed-loop phase linearization circuit 52 substantially linearize the gain and the phase shift, respectively. However, in other embodiments, the closed-loop gain linearization circuit 50 and the closed-loop phase linearization circuit 52 may simply reduce non-linearity.

To regulate the transfer function of the RF amplification circuit 36, the closed-loop gain linearization circuit 50 and the closed-loop phase linearization circuit 52 are each configured to generate one or more control signals. These control signals may be part of the control output 48 provided by the amplifier control circuit 38 to the RF amplification circuit 36. Thus, the control signals generated by the closed-loop gain linearization circuit 50 and the closed-loop phase linearization circuit 52 may be used to directly regulate the transfer function of the RF amplification circuit 36. Additionally and/or alternatively, the control signals may be utilized as inputs to other circuitry within the amplifier control circuit 38. For example, the control signals may be used to regulate the biasing circuitry, the RF power converters, and/or may be utilized as inputs to the control blocks that generate control signals for adjusting the characteristic values in the RF amplification circuit 36. As such, the control signals generated by the closed-loop gain linearization circuit 50 and the closed-loop phase linearization circuit 52 may be used to indirectly regulate the transfer function of the RF amplification circuit 36.

The amplifier control circuit 38 is configured to receive a control input 54 from the RF amplification circuit 36. The control input 54 may include various control signals that indicate parameter values related to the performance of the RF amplification circuit 36. In this regard, the closed-loop gain linearization circuit 50 and the closed-loop phase linearization circuit 52 are closed loop because the control signals generated by the closed-loop gain linearization circuit 50 and the closed-loop phase linearization circuit 52 depend on an output (i.e., the amplified RF signal 26) of the RF amplification circuit 36 or an analog of the output. As such, the control input 54 includes at least one feedback signal 56 that depends on the amplified RF signal 26 or an analog of the amplified RF signal 26.

As mentioned above, the RF amplification device 12 can operate autonomously while still providing wide-band amplification operations. To do this, the closed-loop gain linearization circuit 50 and the closed-loop phase linearization circuit 52 each endogenously establish a set point of the amplified RF signal 26 using the RF signal 24. Accordingly, the RF amplification device 12 and the IC package 14 do not receive an external control signal from the RF communications system 10, such as a reference signal from the RF system control circuitry 30, in order to establish the set points of the closed-loop gain linearization circuit 50 and the closed-loop phase linearization circuit 52. Instead, the closed-loop gain linearization circuit 50 and the closed-loop phase linearization circuit 52 each are configured to establish their respective set points endogenously within the IC package 14. As such, the control input 54 includes at least one reference signal 58 that depends on the RF signal 24. The control input 54 may also include exogenous control signals (e.g., from other package termini) that are received by the closed-loop gain linearization circuit 50 and/or the closed-loop phase linearization circuit 52. For example, these exogenous control signals may indicate a communication band, an RF communication standard, an RF communication specification, and/or a signal frequency of the RF signal 24. These exogenous control signals may be used to change operational characteristics of the closed-loop gain linearization circuit 50 and/or the closed-loop phase linearization circuit 52, such as an operational bandwidth and/or harmonic filter frequencies of the closed-loop gain linearization circuit 50 and/or the closed-loop phase linearization circuit 52.

While the closed-loop gain linearization circuit 50 is activate, the transfer function of the RF amplification circuit 36 defines a closed-loop gain response, and while the closed-loop gain linearization circuit 50 is inactive, the transfer function of the RF amplification circuit 36 defines an open-loop gain response. The amplified RF signal 26 has a signal amplitude, which is related to a signal amplitude (i.e., signal envelope level) of the RF signal 24 by the gain of the RF amplification circuit 36. The set point endogenously established by the closed-loop gain linearization circuit 50 is a target reference amplitude of the signal amplitude of the amplified RF signal 26. The closed-loop gain linearization circuit 50 is configured to set the target reference amplitude according to a target gain magnitude of the gain of the RF amplification circuit 36. In other words, the target reference amplitude indicates what the signal amplitude of the amplified RF signal 26 should be in order to set a gain magnitude of the gain of the RF amplification circuit 36 to the target gain magnitude. As such, the set point of the closed-loop gain linearization circuit 50 is also the target gain magnitude.

Similarly, while the closed-loop phase linearization circuit 52 is activate, the transfer function of the RF amplification circuit 36 defines a closed-loop phase response and, while the closed-loop phase linearization circuit 52 is inactive, the transfer function of the RF amplification circuit 36 defines an open-loop phase response. The set point endogenously established by the closed-loop phase linearization circuit 52 is a target reference phase of the amplified RF signal 26. The amplified RF signal 26 has a signal phase, which is related to a signal phase of the RF signal 24 by a phase shift of the RF amplification circuit 36. The closed-loop gain linearization circuit 50 is configured to set the target reference phase based on the target phase magnitude of the phase shift provided by the RF amplification circuit 36. For example, if the target phase magnitude is approximately zero (0) degrees, then the target reference phase may be approximately equal to the signal phase of the RF signal 24. If the target phase magnitude is approximately one hundred eighty (180) degrees, then the target reference phase may be approximately equal to an inverse of the signal phase of the RF signal 24. By establishing the set points of the closed-loop gain linearization circuit 50 and the closed-loop phase linearization circuit 52 endogenously using the RF signal 24, the RF amplification device 12 can operate autonomously while increasing the linearity of the transfer function of the RF amplification circuit 36. In this manner, the RF amplification device 12 can provide high linearity amplification operations without requiring exogenous control signals from the RF communications system 10 that indicate the set points.

The embodiment of the amplifier control circuit 38 shown in FIG. 1 includes both the closed-loop gain linearization circuit 50 and the closed-loop phase linearization circuit 52. However, it should be noted that in alternative embodiments, the amplifier control circuit 38 may only include either the closed-loop gain linearization circuit 50 or the closed-loop phase linearization circuit 52. Whether both or either of the closed-loop gain linearization circuit 50 and the closed-loop phase linearization circuit 52 are provided may depend on the particular performance characteristics of the RF amplification circuit 36.

Figure 2:
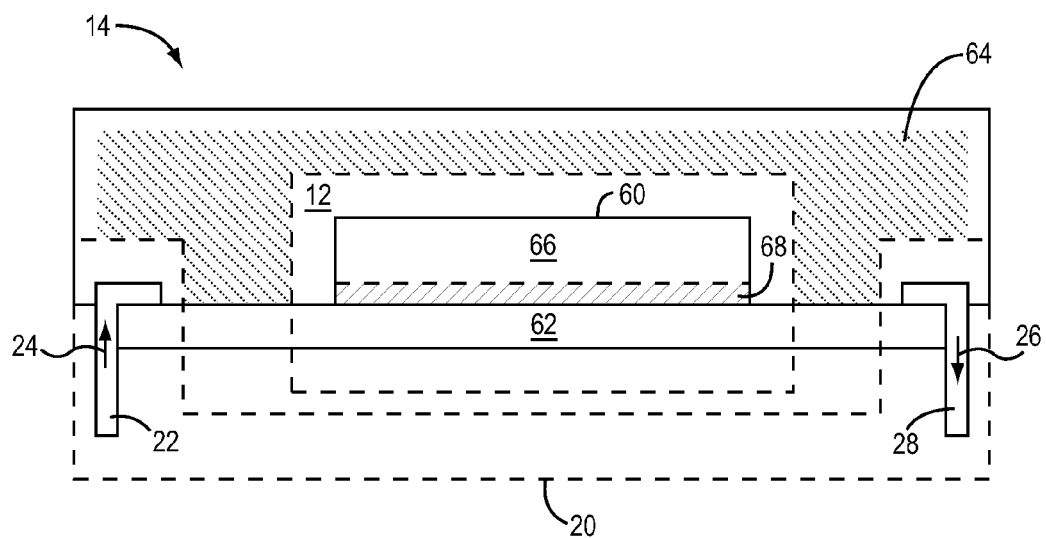
FIG. 2 is a cross-sectional view of an exemplary physical layout of the IC package shown in FIG. 1.

FIG. 2 is a cross-sectional view of an exemplary physical layout of the IC package 14 shown in FIG. 1. The RF amplification device 12 is integrated into the IC package 14 so that the IC package 14 houses the RF amplification device 12. The IC package 14 includes a semiconductor die 60, a package board 62, molding 64, and an exemplary embodiment of the package interface 20 described above in FIG. 1. An IC is formed by the semiconductor die 60. The RF amplification device 12 may be formed partially or entirely by the semiconductor die 60 depending on the application and topology of the RF amplification device 12. In alternative embodiments, the IC package 14 may include multiple semiconductor dice (like the semiconductor die 60) and the RF amplification device 12 may be built on the multiple semiconductor dice. For example, the RF amplification circuit 36 (shown in FIG. 1) and the amplifier control circuit 38 (shown in FIG. 1) may be formed on separate semiconductor dice. Additionally, one or more of the RF amplifier stages 36A, 36B, 36C (shown in FIG. 1) may be built on separate semiconductor dice. Furthermore, the closed-loop gain linearization circuit 50 and the closed-loop phase linearization circuit 52 may be built on separate semiconductor dice. Other types of substrates may be mounted in the IC package 14, such as glass substrates, plastic substrates, or any type of substrate made from a suitable substrate material. Portions of the RF amplification device 12 may be formed on these other types of substrates. These and other combinations would be apparent to one of ordinary skill in the art in light of this disclosure.

With regard to the semiconductor die 60 shown in FIG. 1, the semiconductor die 60 includes a semiconductor substrate 66 used to form active semiconductor components of the IC. The semiconductor substrate 66 may be formed from doped and non-doped layers of a suitable semiconductor material. For example, the semiconductor material may be Silicon (Si), Silicon Germanium (SiGe), Gallium Arsenide (GaAs), Indium Phosphorus (InP), and/or the like. Typical dopants that may be utilized to dope the semiconductor layers are Gallium (Ga), Arsenic (As), Silicon (Si), Tellurium (Te), Zinc (Zn), Sulfur (S), Boron (B), Phosphorus (P), Aluminum Gallium Arsenide (AlGaAs), Indium Gallium Arsenide (InGaAs), and/or the like. Furthermore, metallic layers may be formed on a top, within, and/or a bottom of the semiconductor substrate 66 to provide termini of the active semiconductor components, to form passive impedance elements, and/or the like. Insulating layers, such as oxide layers, and metal layers may also be provided in or on the semiconductor substrate 66. For example, the passive impedance elements may also be formed in or on the semiconductor substrate 66 from the metallic layers.

The semiconductor die 60 also includes a Back-End-of-Line (BEOL) 68, which may be formed from a non-conductive substrate and a plurality of metallic layers provided on or in the insulating substrate. The BEOL 68 is configured to couple the components on the semiconductor substrate 66 to one another. Termini may also be provided by the BEOL 68 to provide connections by external components to the IC. The BEOL 68 may also be used to form passive impedance elements.

A topology of the semiconductor die 60 formed by the semiconductor substrate 66 and the BEOL 68 that form the IC may be in accordance to any suitable semiconductor technology, such as Complementary Metal-On-Oxide Semiconductor technology (CMOS), Bipolar-Complementary Metal-On-Oxide Semiconductor technology (BiCMOS), Silicon-On-Insulator technology (SOI), and/or the like. In this embodiment, the topology of the semiconductor die 60 is provided in accordance with CMOS technology since it is inexpensive, allows the IC to be small, and allows for easy manufacturing. The closed-loop gain linearization circuit 50 (shown in FIG. 1) and the closed-loop phase linearization circuit 52 (shown in FIG. 1) allow for the topology of the semiconductor die 60 to be provided in accordance with CMOS technology while still providing high linearity amplification operations.

The semiconductor die 60 is mounted on the package board 62 within the IC package 14. The package board 62 may be formed by a plurality of board layers formed from a non-conductive material and metallic layers. The non-conductive material that forms the board layers may be a dielectric, a laminate, fibers, glass, ceramic, and/or the like. The dielectric may be a Silicon Oxide ($SiO_x$), Silicon Nitride ($SiN_x$), and/or the like. The laminate may be FR-1, FR-2, FR-3, FR-4, FR-5, FR-6, CEM-1, CEM-2, CEM-3, CEM-4, CEM-5, CX-5, CX-10, CX-20, CX-30, CX-40, CX-50, CX-60, CX-70, CX-80, CX-90, CX-100, and/or the like.

The metallic layers of the package board may be used to form termini, passive impedance components, and connections. For instance, the metallic layers are used to form connections between the semiconductor die 60 and the package interface 20. Also, although the RF amplification device 12 may be provided entirely by the IC formed by the semiconductor die 60, components of the RF amplification device 12 may also be formed using the metallic layers in the package board 62. The semiconductor die 60 shown in FIG. 2 is encapsulated by the molding 64, which may be formed from a non-conductive material to help insulate the semiconductor die 60 and the RF amplification device 12. In this manner, the semiconductor die 60 is protected from external electromagnetic noise generated outside the IC package 14.

FIG. 2 also illustrates an example of the package interface 20. In this embodiment, the package interface 20 is coupled to the package board 62 so that signals can be transmitted to and received from circuitry external to the IC package 14. An embodiment of the first package terminus 22 for receiving the RF signal 24 and an embodiment of the second package terminus 28 for transmitting the amplified RF signal 26 are shown in FIG. 2. In this embodiment, the first package terminus 22 and the second package terminus 28 are each provided as pins connected to the package board 62. An embodiment of the third package terminus 44 (shown in FIG. 1 but not FIG. 2) is also provided as a pin connected to the package board 62. As mentioned above, the RF amplification device 12 may be configured to operate autonomously and thus the IC package 14 may have a small number of pins. For example, the IC package 14 may be less than eleven (11) pins. In this embodiment, the IC package 14 has a total of eight (8) pins.

Figure 3:
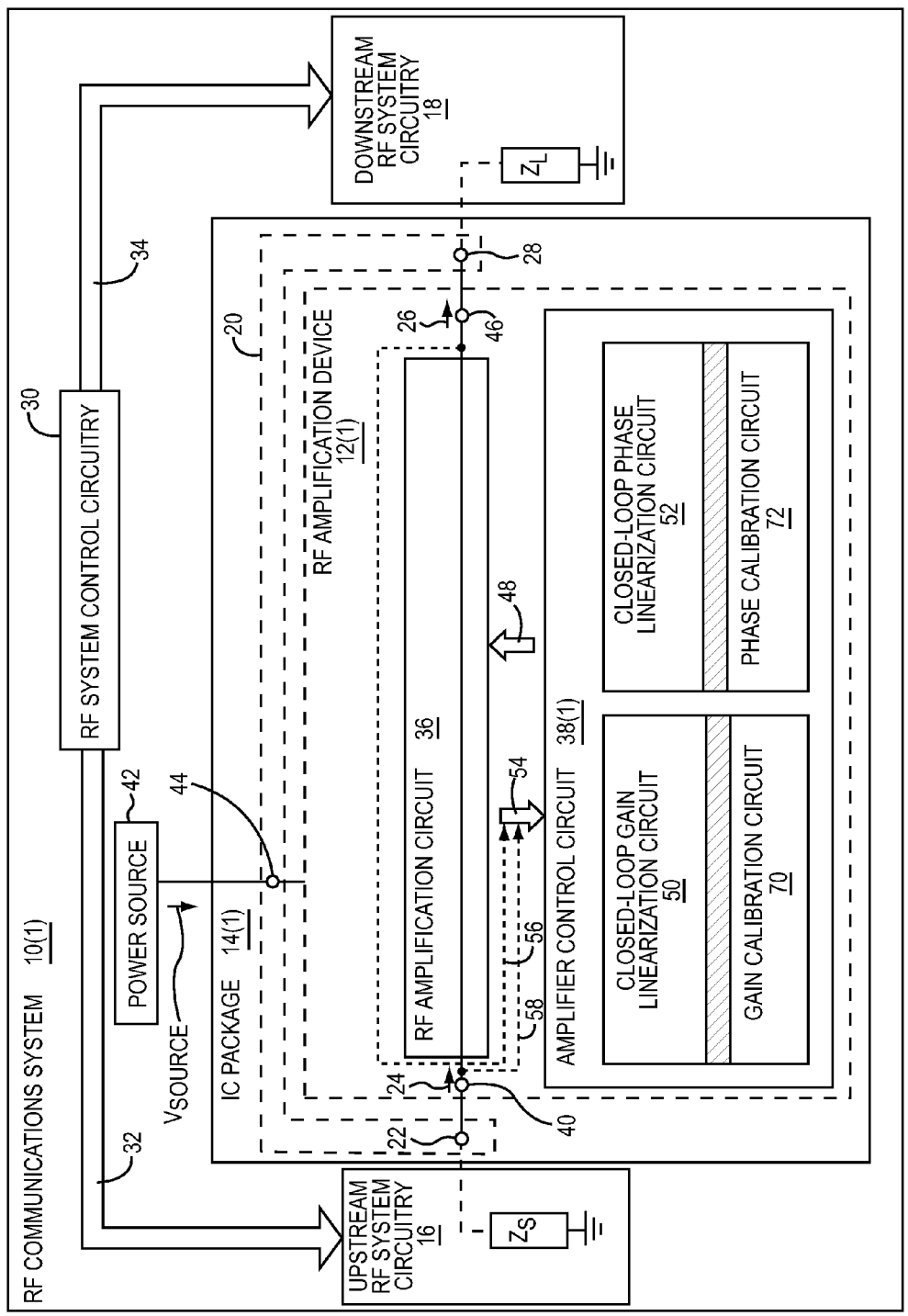
FIG. 3 is a block diagram of another exemplary RF communications system, RF amplification device, and IC package, which are embodiments of the RF communications system, the RF amplification device, and the IC package described above in FIG. 1.

Referring now to FIG. 3, FIG. 3 is a block diagram of another exemplary RF communications system 10(1), RF amplification device 12(1), and an IC package 14(1) that houses the RF amplification device, which are embodiments of the RF communications system 10, the RF amplification device 12, and the IC package 14 described above in FIG. 1. The RF amplification device 12 also includes the RF amplification circuit 36 described above with respect to FIG. 1 along with an amplifier control circuit 38(1). The amplifier control circuit 38(1) is one embodiment of the amplifier control circuit 38 described above with respect to FIG. 1. However, in this embodiment, the amplifier control circuit 38(1) further includes a gain calibration circuit 70 and a phase calibration circuit 72. Alternative embodiments of the amplifier control circuit 38(1) may include only the gain calibration circuit 70 or the phase calibration circuit 72.

Slanted lines are included between the gain calibration circuit 70 and the closed-loop gain linearization circuit 50 in order to indicate that the gain calibration circuit 70 and the closed-loop gain linearization circuit 50 may be partially integrated with one another (and thus share components) or may be independent (and thus not share components). As explained in further below, at small-signal power levels, the closed-loop gain linearization circuit 50 may be deactivated and thus the RF amplification circuit 36 may amplify the RF signal 24 in accordance with the open-loop gain response defined by the transfer function of the RF amplification circuit 36. At these small-signal power levels when the closed-loop gain linearization circuit 50 is inactive, the open-loop gain response may be substantially linear. As discussed above, while the closed-loop gain linearization circuit 50 is activate, the closed-loop gain response defined by the transfer function is also linear. However, without the gain calibration circuit 70, the gain of the RF amplification circuit 36 may be different during the closed-loop gain response and the open-loop gain response. The gain calibration circuit 70 is configured to reduce a difference between the closed-loop gain response and the open-loop gain response. For example, the gain calibration circuit 70 may be configured to substantially eliminate the difference between the closed-loop gain response and the open-loop gain response. Accordingly, the gain of the RF amplification circuit 36 may be substantially the same during the closed-loop gain response and the open-loop gain response.

With regard to the phase-calibration circuitry, slanted lines are included between the phase calibration circuit 72 and the closed-loop phase linearization circuit 52 in order to indicate that the phase calibration circuit 72 and the closed-loop phase linearization circuit 52 may be partially integrated with one another (and thus share components) or may be independent (and thus not share components). As explained further below, at small-signal power levels, the closed-loop phase linearization circuit 52 may be inactive and thus the RF amplification circuit 36 may amplify the RF signal 24 in accordance with the open-loop phase response defined by the transfer function of the RF amplification circuit 36. At these small-signal power levels when the closed-loop phase linearization circuit 52 is inactive, the open-loop phase response may be substantially linear. As discussed above, while the closed-loop phase linearization circuit 52 is activate, the closed-loop phase response defined by the transfer function is also linear. However, without the phase calibration circuit 72, the phase shift of the RF amplification circuit 36 may be different during the closed-loop phase response and the open-loop phase response. The phase calibration circuit 72 is configured to reduce a difference of the closed-loop phase response and the open-loop phase response. For example, the phase calibration circuit 72 may be configured to substantially eliminate the difference between the closed-loop phase response and the open-loop phase response. Accordingly, the phase shift of the RF amplification circuit 36 may be substantially the same during the closed-loop phase response and the open-loop phase response.

Figure 4:
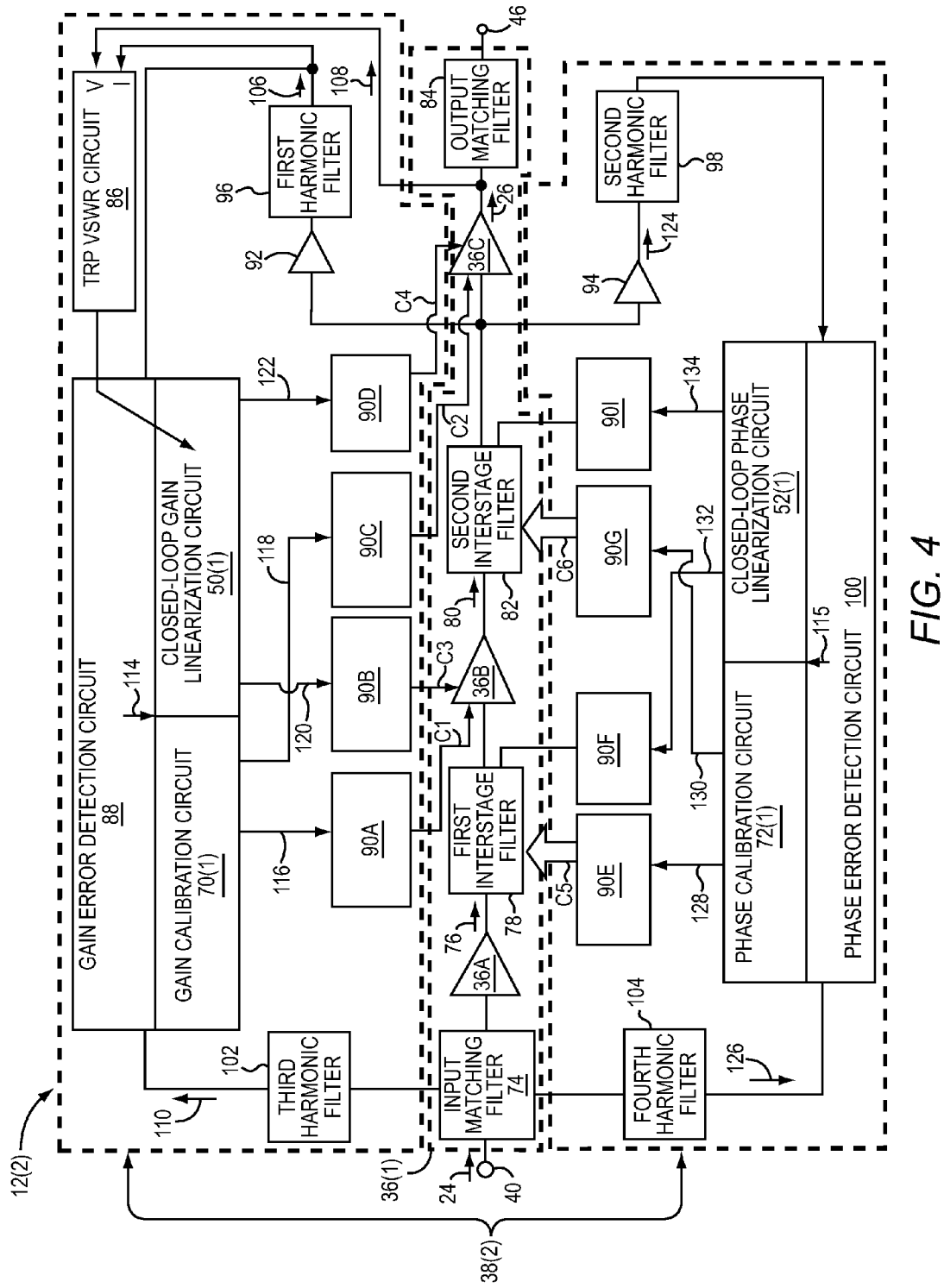
FIG. 4 illustrates a block diagram of another embodiment of an RF amplification device, which is a more detailed example of the RF amplification device shown in FIG. 3.

FIG. 4 illustrates a block diagram of another embodiment of an RF amplification device 12(2), which is a more detailed example of the RF amplification device 12(1) shown in FIG. 3. The RF amplification device 12(2) includes one embodiment of an RF amplification circuit 36(1) and an embodiment of an amplifier control circuit 38(2). The RF amplification circuit 36(1) is one embodiment of the RF amplification circuit 36 described above in FIG. 1. However, in this embodiment, the RF amplification circuit 36(1) includes a plurality of RF amplifier stages 36A, 36B, 36C coupled in cascade. Accordingly, each of the plurality of RF amplifier stages 36A, 36B, 36C is operable to provide amplification and by being coupled in cascade, the RF amplifier stages 36A, 36B, 36C provide amplification to the RF signal 24 in sequence.

The RF amplification circuit 36(1) shown in FIG. 1 has an initial RF amplifier stage 36A, an intermediate RF amplifier stage 36B, and a final RF amplifier stage 36C. However, other embodiments of the RF amplification circuit 36(1) may include any number of RF amplifier stages as described above. Often, the initial RF amplifier stage 36A and the intermediate RF amplifier stage 36B are classified as "driver" RF amplifier stages. Since the final RF amplifier stage 36C handles the most power, some embodiments of the final RF amplifier stage 36C may include arrays of transistors or stacks of transistors in order to handle the power levels seen by the final RF amplifier stage 36C.

In this embodiment, an input matching filter 74 is configured to initially receive the RF signal 24 from the input terminus 40. The input matching filter 74 is configured to substantially match an input impedance of the RF amplification circuit 36(1) to the source impedance $Z_S$ (shown in FIG. 1) of the upstream RF system circuitry 16 (shown in FIG. 1). Since the RF amplifier stages 36A, 36B, 36C are coupled in cascade, the RF amplifier stages 36A, 36B, 36C provide amplification to the RF signal 24 in a sequence. Accordingly, the initial RF amplifier stage 36A receives the RF signal 24 from the input matching filter 74. The initial RF amplifier stage 36A is configured to amplify the RF signal 24 so as to generate a first interstage RF signal 76 in accordance with an amplifier gain $G_{initial}$. A first interstage filter 78 is coupled between the initial RF amplifier stage 36A and the intermediate RF amplifier stage 36B. The first interstage filter 78 is configured to filter undesired signal components (e.g., noise and/or harmonics) from the first interstage RF signal 76 after amplification by the initial RF amplifier stage 36A. Once the RF signal 24 is amplified by the initial RF amplifier stage 36A and the first interstage RF signal 76 has been filtered by the first interstage filter 78, the intermediate RF amplifier stage 36B receives the first interstage RF signal 76.

The intermediate RF amplifier stage 36B is configured to amplify the first interstage RF signal 76 so as to generate a second interstage RF signal 80 in accordance with an amplifier gain $G_{intermediate}$. A second interstage filter 82 is coupled between the intermediate RF amplifier stage 36B and the final RF amplifier stage 36C. The second interstage filter 82 is configured to filter undesired harmonics from the second interstage RF signal 80 after amplification by the intermediate RF amplifier stage 36B. Once the first interstage RF signal 76 is amplified by the intermediate RF amplifier stage 36B and the second interstage RF signal 80 has been filtered by the second interstage filter 82, the final RF amplifier stage 36C receives the second interstage filter 82. The final RF amplifier stage 36C is configured to amplify the RF signal 24 so as to generate the amplified RF signal 26 in accordance to an amplifier gain $G_{final}$. As such, the gain of the RF amplification circuit 36(1) may be described as $G_{initial}*G_{intermediate}*G_{final}$. An output matching filter 84 is coupled to the final RF amplifier stage 36C so as to receive the amplified RF signal 26. The output matching filter 84 is configured to substantially match an output impedance of the RF amplification circuit 36(1) to the load impedance 4, (shown in FIG. 1) of the downstream RF system circuitry 18 (shown in FIG. 1).

The amplifier gain $G_{initial}$, the amplifier gain $G_{intermediate}$, and the amplifier gain $G_{final}$ may each be any type of amplifier gain (e.g., a voltage gain, a transconductance gain, a transresistance gain, a current gain) depending on the topology of each of the corresponding RF amplifier stages 36A, 36B, 36C. For example, the amplifier gain $G_{initial}$, the amplifier gain $G_{intermediate}$, and the amplifier gain $G_{final}$ may each be the same type of amplifier gain or each may be a different types of amplifier gain. As such, the gain of the RF amplification circuit 36(1) may be any type of amplifier gain depending on a combination of the types amplifier gain $G_{initial}$, the amplifier gain $G_{intermediate}$, and the amplifier gain $G_{final}$ provided by each of the RF amplifier stages 36A, 36B, 36C.

Note that as amplification progresses through the sequence of the RF amplifier stages 36A, 36B, 36C, each of the RF amplifier stages 36A, 36B, 36C, handles an increasing amount of power. Therefore, the initial RF amplifier stage 36A handles the least amount of power, since it receives the RF signal 24 prior to amplification and transmits the first interstage RF signal 76 amplified only in accordance with the amplifier gain $G_{initial}$. In one embodiment, the amplifier gain $G_{initial}$ is a voltage gain. Thus, the initial RF amplifier stage 36A amplifies the RF signal 24 such that the amplifier gain $G_{initial}$ approximately describes a proportion between a voltage level of the first interstage RF signal 76 and a voltage level of the RF signal 24.

When the intermediate RF amplifier stage 36B receives the first interstage RF signal 76, the first interstage RF signal 76 has already been amplified by the amplifier gain $G_{initial}$. The intermediate RF amplifier stage 36B further amplifies the first interstage RF signal 76 and generates the second interstage RF signal 80. Thus, the intermediate RF amplifier stage 36B transmits the second interstage RF signal 80 amplified in accordance with the amplifier gain $G_{initial}*G_{intermediate}$. As a result, the intermediate RF amplifier stage 36B handles an intermediate amount of power. In one embodiment, the amplifier gain $G_{intermediate}$ is a transconductance gain. Thus, the intermediate RF amplifier stage 36B amplifies the first interstage RF signal 76 such that the amplifier gain $G_{intermediate}$ approximately describes a proportion between a current level of the second interstage RF signal 80 and the voltage level of the first interstage RF signal 76.

With regard to the final RF amplifier stage 36C, the final RF amplifier stage 36C receives the second interstage RF signal 80 amplified in accordance with the aggregate amplifier gain $G_{initial}*G_{intermediate}$. As such, when the final RF amplifier stage 36C further amplifies the second interstage RF signal 80 so as to generate the amplified RF signal 26. In one embodiment, the amplifier gain $G_{final}$ is a current gain. Thus, the final RF amplifier stage 36C amplifies the second interstage RF signal 80 such that the amplifier gain $G_{final}$ approximately describes a proportion between a current level of the amplified RF signal 26 and the current level of the second interstage RF signal 80. The final RF amplifier stage 36C thus transmits the amplified RF signal 26 amplified in accordance with the (total) gain $(G_{initial}*G_{intermediate}*G_{final})$ of the RF amplification circuit 36(1). As such, the final RF amplifier stage 36C handles the most power. Furthermore the (total) gain of the RF amplification circuit 36(1) is a transconductance gain.

Alternatively, the amplifier gain $G_{final}$ of the final RF amplifier stage 36C may be a transconductance gain. In this alternative embodiment, the output matching filter 84 may be configured to present an input impedance that converts a current level of the amplified RF signal 26 provided by the final RF amplifier stage 36C into a voltage level. Additionally, in another alternative embodiment, the amplifier gain $G_{intermediate}$ of the intermediate RF amplifier stage 36B is a transconductance gain, and a load impedance of the second interstage filter 82 converts a current level of the second interstage RF signal 80 into a voltage level.

FIG. 4 also illustrates the amplifier control circuit 38(2) used to regulate the RF amplification circuit 36(1). The amplifier control circuit 38(2) includes a closed-loop gain linearization circuit 50(1), a phase calibration circuit 72(1), a gain calibration circuit 70(1), and a phase calibration circuit 72(1), which are embodiments of the closed-loop gain linearization circuit 50, the phase calibration circuit 72, the gain calibration circuit 70, and the phase calibration circuit 72 described above with respect to FIGS. 1 and 3. The amplifier control circuit 38(2) further includes a Total Radiated Power (TRP) Voltage Standing Wave Ratio (VSWR) circuit 86, a gain error detection circuit 88, a driver stage gain control block 90A, a driver stage gain control block 90B, a final stage gain control block 90C, a final stage gain control block 90D, a driver stage phase control block 90E, a driver stage phase control block 90F, a final stage phase control block 90G, a final stage phase control block 901, a first final stage replica amplifier 92, a second final stage replica amplifier 94, a first harmonic filter 96, a second harmonic filter 98, a phase error detection circuit 100, a third harmonic filter 102, and a fourth harmonic filter 104.

The TRP VSWR circuit 86 is a closed-loop feedback control circuit configured to make a VSWR measurement and adjust a feedback gain of the closed-loop gain linearization circuit 50 in accordance with the VSWR measurement. For example, the TRP VSWR circuit 86 may be configured to adjust the feedback gain of the closed-loop gain linearization circuit 50 in accordance with the VSWR measurement so as to maintain an output power level of the amplified RF signal 26 substantially constant over a range of the load impedance $Z_L$ (shown in FIG. 1). The TRP VSWR circuit 86 may be configured to adjust the feedback gain of the closed-loop gain linearization circuit 50 in accordance with the VSWR measurement so as to maintain the closed-loop gain linearization circuit 50 out of unstable control regions. In order to make the VSWR measurement, the TRP VSWR circuit 86 is configured to receive a first feedback signal 106 and a second feedback signal 108. The first feedback signal 106 has a first feedback signal level that is indicative of a current level of the amplified RF signal 26. The second feedback signal 108 has a second feedback signal level that is indicative of a voltage level of the amplified RF signal 26. As such, the TRP VSWR circuit 86 is configured to make the VSWR measurement using the first feedback signal 106 and the second feedback signal 108. In combination, the first feedback signal level of the first feedback signal 106 and the second feedback signal level of the second feedback signal 108 are indicative of TRP of the amplified RF signal 26.

In this embodiment, the closed-loop gain linearization circuit 50 and the gain calibration circuit 70 are partially amalgamated since the closed-loop gain linearization circuit 50 and the gain calibration circuit 70 share the gain error detection circuit 88. Alternatively, the closed-loop gain linearization circuit 50 and the gain calibration circuit 70 may each have independent error detection circuits (like the gain error detection circuit 88) and may thus be independent of one another. In this embodiment, the gain error detection circuit 88 is configured to receive the first feedback signal 106 and a first reference signal 110 having a reference signal level that is indicative of a power level of the RF signal 24. Using the first reference signal 110, the gain error detection circuit 88 is configured to set the set point of the closed-loop gain linearization circuit, which is indicative of the target reference amplitude of the amplified RF signal 26. The set point therefore further indicates the target gain magnitude, and is established based on the reference signal level of the first reference signal 110. By having the TRP VSWR circuit 86 adjust the feedback gain based on the VSWR measurement and using the first feedback signal 106, the gain error detection circuit 88 is configured to provide feedback indicative of a signal power level of the amplified RF signal 26. The gain error detection circuit 88 is configured to compare the feedback and the set point to generate a gain error signal 114 having an error signal level indicative of a power level error between the feedback and the set point. For example, the reference signal level may indicate a current level of the amplified RF signal 26. Given an impedance value of the load impedance $Z_L$ (shown in FIG. 1), the current level indicates the signal power level. If the impedance value changes to a different impedance value, the TRP VSWR circuit 86 adjusts the feedback gain so that the current level of the amplified RF signal 26 continues to indicate the signal power level of the amplified RF signal 26. As such, the reference signal level also indicates the signal power level.

The gain error signal 114 is provided to the closed-loop gain linearization circuit 50(1) and the gain calibration circuit 70(1). With regard to the gain calibration circuit 70(1), the gain calibration circuit 70(1) is configured to use the gain error signal 114 to determine calibration points as explained in further detail below. In this embodiment, the gain calibration circuit 70(1) is operably associated with the driver stage gain control block 90A and the final stage gain control block 90C. As shown in the following description, two or more gain control blocks 90A, 90C can be provided to operate with more than one of the RF amplifier stages 36A, 36B, 36C. In this embodiment, the gain calibration circuit 70(1) is configured to generate a first gain calibration signal 116 which is received by the driver stage gain control block 90A and a second gain calibration signal 118 which is received by the final stage gain control block 90C. The driver stage gain control block 90A is configured to generate a control signal C1 that sets the gain of the intermediate RF amplifier stage 36B while the final stage gain control block 90C is configured to generate a control signal C2 that sets the gain of the final RF amplifier stage 36C. With the first gain calibration signal 116 and the second gain calibration signal 118, the gain calibration circuit 70(1) is configured to control the driver stage gain control block 90A and the final stage gain control block 90C and thereby control the gain of the RF amplification circuit 36(1). As explained in further detail below, the gain calibration circuit 70(1) controls the gain of the RF amplification circuit 36(1) in order to reduce the difference between the open-loop gain response and closed-loop gain response of the RF amplification circuit 36(1). In one exemplary embodiment, the driver stage gain control block 90A is an impedance control and the control signal C1 is an impedance control signal that sets an internal impedance level of the intermediate RF amplifier stage 36B. Additionally, the final stage gain control block 90C is a final stage biasing circuit and the control signal C2 is a bias signal that sets a quiescent operating level of the final RF amplifier stage 36C. In alternative embodiments, the gain control blocks 90A, 90C may be configured to control other operational characteristics such as biasing, impedance, and the like.

With regard to the closed-loop gain linearization circuit 50(1), the closed-loop gain linearization circuit 50(1) is configured to adjust the gain of the RF amplification circuit 36(1) in accordance to the gain error signal 114 while activated so as to maintain the gain of the RF amplification circuit 36(1) relatively constant. In this embodiment, the closed-loop gain linearization circuit 50(1) is operably associated with the driver stage gain control block 90B and the final stage gain control block 90D. The closed-loop gain linearization circuit 50(1) is configured to generate a first gain control signal 120 which is received by the driver stage gain control block 90B and a second gain control signal 122 which is received by the final stage gain control block 90D. The driver stage gain control block 90B is configured to generate a control signal C3 that sets the gain of the intermediate RF amplifier stage 36B while the final stage gain control block 90D 90CF is configured to generate a control signal C4 that sets the gain of the final RF amplifier stage 36C. With the first gain control signal 120 and the second gain control signal 122, the closed-loop gain linearization circuit 50(1) is configured to control the driver stage gain control block 90B and the final stage gain control block 90D and thereby control the gain of the RF amplification circuit 36(1). As explained in further detail below, the closed-loop gain linearization circuit 50(1) regulates the gain of the RF amplification circuit 36(1) in order to maintain the closed-loop gain response of the RF amplification circuit 36(1) substantially constant. In one exemplary embodiment, the driver stage gain control block 90B is an impedance control block with a low pass filter and the control signal C3 is an impedance control signal that sets an internal impedance level of the intermediate RF amplifier stage 36B. Additionally, the final stage gain control block 90D is a biasing circuit with a low pass filter and the control signal C4 is a bias signal that sets the quiescent operating level of the final RF amplifier stage 36C.

With regard to phase control, the closed-loop phase linearization circuit 52(1) and the phase calibration circuit 72(1) are partially amalgamated since the closed-loop phase linearization circuit 52(1) and the phase calibration circuit 72(1) share a phase error detection circuit 100. Alternatively, the closed-loop phase linearization circuit 52(1) and the phase calibration circuit 72(1) may each have independent error detection circuits (like the phase error detection circuit 100) and may thus be independent of one another. In this embodiment, the phase error detection circuit 100 is configured to receive a third feedback signal 124 having a third feedback signal level that indicates a phase of the amplified RF signal 26 and a second reference signal 126 having a second reference signal level that is indicative of a phase of the RF signal 24. Using the second reference signal 126, the phase error detection circuit 100 is configured to set the set point of the closed-loop phase linearization circuit 52(1), which is indicative of a target phase shift of the RF amplification circuit 36(1). The phase error detection circuit 100 is also configured to compare measure the phase shift of the RF amplification circuit 36(1) using the third feedback signal 124 and the second reference signal 126 as feedback. The phase error detection circuit 100 generates a phase error signal 115 having an error signal level indicative of a phase shift error between the feedback and the set point (reference).

The phase error signal 115 is provided to the closed-loop phase linearization circuit 52(1) and the phase calibration circuit 72(1). With regard to the phase calibration circuit 72(1), the phase calibration circuit 72(1) is configured to use the phase error signal 115 to determine calibration points as explained in further detail below. In this embodiment, the phase calibration circuit 72(1) is operably associated with the driver stage phase control block 90E and the final stage phase control block 90G. The phase calibration circuit 72(1) is configured to generate a first phase calibration signal 128 which is received by the driver stage phase control block 90E and a second phase calibration signal 130 which is received by the final stage phase control block 90G. The driver stage phase control block 90E is configured to generate a control output C5 that sets a phase shift of the intermediate RF amplifier stage 36B while the final stage phase control block 90G is configured to generate a control output C6 that sets a phase shift of the final RF amplifier stage 36C. With the first phase calibration signal 128 and the second phase calibration signal 130, the phase calibration circuit 72(1) is configured to control the driver stage phase control block 90E and the final stage phase control block 90G and thereby regulate the phase shift of the RF amplification circuit 36. As explained in further detail below, the phase calibration circuit 72(1) controls the phase shift of the RF amplification circuit 36 in order to reduce the difference between the open-loop phase response and closed-loop phase response of the RF amplification circuit 36. In one exemplary embodiment, the driver stage phase control block 90E is an impedance control circuit and the control output C5 is a control word that sets a capacitance of a capacitor bank in the first interstage filter 78. Additionally, the final stage phase control block 90G is an impedance control circuit and the control output C6 is a control word that sets a capacitance of a capacitor bank in the second interstage filter 82.

With regard to the closed-loop phase linearization circuit 52(1), the closed-loop phase linearization circuit 52(1) is configured to adjust the phase shift of the RF amplification circuit 36 in accordance to the phase error signal 115 while activated so as to maintain the phase shift of the RF amplification circuit 36 relatively constant. In this embodiment, the closed-loop phase linearization circuit 52(1) is operably associated with the driver stage phase control block 90F and the final stage phase control block 90I. The closed-loop phase linearization circuit 52(1) is configured to generate a first phase control signal 132 which is received by the driver stage phase control block 90F and a second phase control signal 134 which is received by the final stage phase control block 90I. The driver stage phase control block 90F is configured to set the phase shift of the first interstage filter 78 and/or the intermediate RF amplifier stage 36B using the first phase control signal 132, while the final stage phase control block 90I is configured to set the phase shift of the second interstage filter 82 and/or the final RF amplifier stage 36C using the second phase control signal 134. In this manner, the closed-loop phase linearization circuit 52(1) is configured to control the phase shift of the RF amplification circuit 36(1). In one exemplary embodiment, the driver stage phase control block 90F is a varactor and the first phase control signal 132 is used to set a variable capacitance of the varactor. Additionally, the final stage phase control block 90I may also be a varactor and the second phase control signal 134 is used to set a variable capacitance of the varactor.

To avoid the use of bulky couplers for power detection, a first final stage replica amplifier 92 is configured to generate the first feedback signal 106. As mentioned above, the first feedback signal level of the first feedback signal 106 is indicative of the current level of the amplified RF signal 26. However, in this embodiment, the first feedback signal 106 is not generated as direct feedback resulting from the amplified RF signal 26. Instead, the first final stage replica amplifier 92 is configured to generate the first feedback signal 106 as an analog of the amplified RF signal 26. The first final stage replica amplifier 92 is a scaled-down version of the final RF amplifier stage 36C and is coupled to receive the second interstage RF signal 80 just like the final RF amplifier stage 36C. The first final stage replica amplifier 92 is configured to generate the first feedback signal 106 such that the first feedback signal level is a scaled down replication of the current level of the amplified RF signal 26. Since the first feedback signal 106 is not filtered by the output matching filter 84, the first harmonic filter 96 is configured to filter high-frequency harmonics from the first feedback signal 106 and increase the performance of the gain error detection circuit 88. Furthermore, it should be noted that the TRP VSWR circuit 86 is coupled to receive the second feedback signal 108 before the amplified RF signal 26 is filtered by the output matching filter 84. This avoids a propagation delay of the output matching filter 84, which can be detrimental to the operations of the TRP VSWR circuit 86.

The second final stage replica amplifier 94 shown in FIG. 4 is configured to generate the third feedback signal 124. As mentioned above, the third feedback signal level of the third feedback signal 124 is indicative of the phase of the amplified RF signal 26. In this way, the static or slowly varying phase coming from the load impedance $Z_L$ (shown in FIG. 1) is rejected and only the dynamic phase variation is passed to the closed-loop phase linearization circuit 52(1). However, the third feedback signal 124 is not generated as direct feedback resulting from the amplified RF signal 26. Instead, the second final stage replica amplifier 94 is configured to generate the third feedback signal 124 as an analog of the amplified RF signal 26. The second final stage replica amplifier 94 is a scaled-down version of the final RF amplifier stage 36C and is coupled to receive the second interstage RF signal 80 just like the final RF amplifier stage 36C. The second final stage replica amplifier 94 is configured to generate the third feedback signal 124 such that a phase of the third feedback signal 124 matches the phase of the amplified RF signal 26. Since the third feedback signal 124 is not filtered by the output matching filter 84, the second harmonic filter 98 is configured to filter high-frequency harmonics from the third feedback signal 124 and increase the performance of the phase error detection circuit 100.

With regard to reference paths, the third harmonic filter 102 is configured to filter signal components (e.g., noise, harmonics) from the first reference signal 110 and increase the performance of the gain error detection circuit 88. In this manner, the input matching filter 74 can provide impedance matching with the source impedance $Z_S$ (shown in FIG. 1) while the third harmonic filter 102 removes unwanted signal components from the first reference signal 110. Similarly, the fourth harmonic filter 104 is configured to filter signal components (e.g., noise, harmonics) from the second reference signal 126 and increase the performance of the gain error detection circuit 88. In this manner, the input matching filter 74 can provide impedance matching with the source impedance $Z_S$ (shown in FIG. 1) while the fourth harmonic filter 104 removes unwanted signal components from the second reference signal 126.

FIG. 6A illustrates a communication circuit 190 including a replicator circuit 198. Specifically, input node 162 sends input signal 164 to amplification circuit 166. Amplification circuit 166 includes at least one amplifier 168, and also sends output signal 192 to output node 194.

Output signal 192 is almost equal to amplified signal 170 from FIG. 5, because sensed signal 196 draws very little power (relative to the power drawn by sensed signal 178 in FIG. 5).

Amplification circuit 166 sends sensed signal 196 towards replicator circuit 198. Replicator circuit 198 replicates at least a portion of amplification circuit 166, such that replicated signal 200 provides information about output signal 192. Specifically, replicator circuit 198 emulates (in a scaled down fashion) at least a portion of amplification circuit 166, such that output signal 192 is replicated (or more specifically, is emulated). Thus, it is not necessary to directly measure output signal 192 by power coupling. Replicator circuit 198 sends replicator signal 200 towards correction circuit 202. Scaling is discussed below.

Correction circuit 202 may perform signal processing on replicator signal 200, and then send control signal 204 towards amplification circuit 166.

Thus, replicator circuit 198 and correction circuit 202 form a control loop (feedback circuit or feed forward circuit) for amplification circuit 166. If control signal 204 interacts with amplification circuit 166 before (upstream of) sensed signal 196, then the control loop is a feedback circuit. There are many types of feedback circuits and feed forward circuits, and all types are covered by this disclosure.

The correction may be performed by comparing the sensed signal 196 with a reference signal (not shown) and developing an error signal (not shown). In this case, correction is dependent upon an error signal, and the error signal may be used to control a gain of the amplification circuit. This case may be described as a "classic feedback."

Alternatively, the correction may be performed based only upon the sensed signal (without any reference signal, and without any calculation of error). This may be described as "blind" correction.

A voltage matching circuit and/or a capacitance matching circuit may be located between amplification circuit 166 and replicator circuit 198 as discussed below.

FIG. 6B illustrates a communication circuit 195 including a replicator overall circuit 241.

Specifically, FIG. 6B is similar to FIG. 6A, but introduces replicator overall circuit 241 including signal matching circuit 230, capacitance matching circuit 235, and replicator circuit 240. Intermediate signal 297 is generated by amplification circuit 220, and is received by capacitance matching circuit 235. Capacitance matching circuit 235 is coupled to replicator circuit 240 through signal 298. Replicator circuit 240 is coupled to replicator load Zreplicator. Replicator load Zreplicator corresponds to a load caused by correction circuit 202 in FIG. 6A.

Output matching filter 250 is coupled to amplification circuit 220 and to load impedance ZL, and is described in more detail below with respect to FIG. 7.

Replicator circuit 240 receives the same input signal 252 that is received by amplification circuit 220. In general, replicator circuit 240 is a scaled down version of amplifier circuit 220, and also has a similar configuration in order to facilitate the signal replication duties of replicator circuit 240.

One important difference is that amplifier circuit 220 is connected, through an output matching filter 250 (optionally including a switch), to a load ZL that can have a certain variation (VSWR). In contrast, replicator circuit 240 is connected to a load Zreplicator that is not directly related to ZL, and in many cases Zreplicator is constant or varies only slightly over a narrow range.

Therefore, additional circuitry is needed in replicator overall circuit 241 to ensure an accurate replication or emulation by replicated signal 246 of amplified signal 226 over all regimes of operation by amplification circuit 220. These regimes include, but are not restricted to: small signal regime, linear regime, non-linear regime, early (soft) saturation, and hard saturation (clipping).

In many cases, amplification circuit 220 may be approximated with a current source. See discussion below regarding FIG. 6C.

FIG. 6C illustrates current source models.

Specifically, amplification circuit 220 may be modeled (in some regimes) by variable current source 295, that is controlled by control voltage Vctrl2. In other regimes, amplification circuit 220 may be modeled by a voltage source (not shown), or by a combination (not shown) of a current source and a voltage source.

Similarly, amplification circuit 220 may be modeled by variable current source 296 that is controlled by control voltage Vctrl4. Also, similarly, replicator circuit 240 may be modeled by a voltage source (not shown), or by a combination (not shown) of a current source and a voltage source.

In many cases, amplification circuit 220 may be approximated by a current source Iamp 295 (and a parallel impedance, not shown) that is controlled by one or more control voltages Vctrl2. In this case, replicator circuit 240 may be modeled by a scaled down current source Irep 296 that is controlled by one or more control voltages Vctrl4. The one or more control voltages Vctrl4 may be identical to the one or more control voltages Vctrl2, or may be scaled down relative to control voltages Vctrl2.

To ensure that these currents behave similarly up to a certain constant ratio, control voltages Vctr4 of replicator circuit 240 need to follow in a certain manner control voltages Vctrl2 of amplification circuit 220.

In other cases (not shown) amplification circuit 220 may be represented by a voltage source with a finite series impedance. In this case, replicator circuit 240 may also be represented by a voltage source with a finite series impedance.

In other cases (not shown), amplification circuit 220 may be represented by a current source and a parallel impedance for a first regime of operation, and by a voltage source and a series impedance for a second regime of operation.

In other cases (not shown), amplification circuit 220 may be represented by a combination of a current source and a voltage source and several impedances, and replicator circuit 240 may be similarly represented.

Amplification circuit 220 and replicator circuit 240 have the same input signal 252, but have different output signals (amplified signal 226 and replicated signal 246 respectively).

Therefore, signal matching circuit 230 helps to ensure that the amplification circuit 220 and replicator circuit 240 stay in synchronization as the load impedance ZL changes. Furthermore, a transistor in amplification circuit 220 and a corresponding transistor in replicator circuit 240 do not necessarily operate in the same regime due to their different signal levels.

One consequence of operating in different regimes is that different capacitance values (often non-linear) are present in a main signal path in amplification circuit 220 than in a main signal path in replicator circuit 240 (in addition to a generally fixed scaling ratio between these circuits).

Different capacitances in a signal path may result in different gain and phase behavior between amplification circuit 220 and replicator circuit 240. These different capacitances lead to errors in the replication process for gain and/or phase components of signals.

To address this difficulty, capacitance matching circuit 235 is present in replicator overall circuit 241 to ensure that a capacitance in a signal path of replicator circuit 240 matches a capacitance in a signal path of amplification circuit 220 (up to a constant ratio), over the entire range of operating conditions, regimes, and modes.

Referring back to FIG. 6B, in one embodiment, both capacitance matching circuit 235 and signal matching circuit 230 receive signals from amplification circuit 220. These signals may include intermediate signal 297, input signal 252, and amplified signal 226. Intermediate signal 297 may be a bias signal used by amplification circuit 220, or may be an internal signal generated by transistors in amplification circuit 220.

These received signals are processed by signal matching circuit 230 and capacitance matching circuit 235, and used to interact with replicator circuit 240. Thus, replicator circuit 240 may avoid directly interacting with amplified signal 226.

FIG. 7 is a communication circuit 210 including: bias circuit 212, bias circuit 214, amplification circuit 220 (including transistor 222 and transistor 224), replicator circuit 240 (including transistor 242 and transistor 244), and output matching filter 250.

Amplification circuit 220 receives input signal 252 at the gate of transistor 222. Input signal 252 is coupled to the gate of transistor 242 in replicator 240. Transistor 224 is stacked with transistor 222, and receives bias signal 258 at the gate of transistor 224. Bias signal 258 is coupled to voltage matching circuit 230. Amplification circuit 220 sends amplified signal 226 to voltage matching circuit 230 and to output matching filter 250. Two or more devices may be stacked with amplification circuit 220 and replicator circuit 240.

Output matching filter 250 optionally matches, optionally filters, and optionally switches amplified signal 226 to generate output signal 252. Output node 254 receives input signal 252, and is coupled to variable external load 256. Variable external load 256 may be an antenna (not shown) of a cellular phone (not shown). In the case of an antenna in a cell phone, electrical interaction with a user's hand (or head, etc.) may substantially modify the external load, and thus may affect amplified signal 226.

Voltage matching circuit 230 optionally receives bias signal 258 and optionally receives amplified signal 226 (and/or any other internal signals from amplification circuit 220), then sends matched signal 232 to the gate of transistor 244. FIGS. 8-13 provide many embodiments of voltage matching circuit 230.

Alternatively (not shown), voltage matching circuit 230 may be considered part of replicator circuit 240.

Voltage Vgs from the gate to the source of transistor 222 is equivalent to voltage RVgs from the gate to the source of transistor 242, because these gates are tied together. Transistor 242 replicates (emulates) transistor 222. Input signal 252 may be a sensed signal corresponding to sensed signal 196 in FIG. 6. Matched signal 232 may also be a sensed signal corresponding to sensed signal 196 in FIG. 6. In other words, replicator circuit 240 may receiver multiple sensed signals directly (such as input signal 252) or indirectly (such as matched signal 232) from amplification circuit 220.

Transistor 242 has a smaller active area than transistor 222, because transistor 242 is intended for low power usage and because transistor 242 does not have to drive the low value and variable external load 256. Instead, transistor 242 (and other transistors in replicator circuit 240) only has to generate a relatively low power replicated signal 246 for correction circuit 260, such that correction circuit 260 can generate control signal 262 to control amplification circuit 220.

To summarize, replicator circuit 240 can be much smaller (and need much less power) than amplification circuit 220. Replicator circuit 240 emulates (on a much smaller scale) amplification circuit 220.

Vds is the voltage from the source of transistor 224 to the source of transistor 222. Voltage RVds is the voltage from the source of transistor 244 to the source of transistor 242.

Replicator circuit 240 outputs replicated signal 246 to replication output node 247. Correction circuit 260 receives replicated signal 246, and outputs control signal 262. Control signal 262 may be used to control amplification circuit 220, and may be used to control preceding stages such as pre-stage driver 219.

Thus, replicator circuit 240 (with optional assistance from voltage matching circuit 230) replicates or emulates amplification circuit 220.

Replicator circuit 240 may be a double cascoded N-channel transistor stack, and may have transistors that are 1% or less of the size of corresponding transistors in the amplification circuit. Thus, the replicator circuit 240 uses very little space and consumes very little power.

Specifically, in one embodiment, transistors in replicator circuit 240 have active areas less than 10% the size of active areas of corresponding transistors in amplification circuit 220. In another embodiment, transistors in replicator circuit 240 have active areas less than 1% the size of active areas of corresponding transistors in amplification circuit 220.

FIG. 8 illustrates a communication circuit 300 including a bias switching circuit 340 and a replicator circuit 350. FIG. 8 intentionally omits correction circuit 260 and control signal 262 from FIG. 7, in order to create space to provide additional details (such as bias switching circuit 340) as discussed below.

In this case, voltage matching circuit 330 plays the role of signal matching circuit 230 from FIG. 6B. Specifically, communication circuit 300 includes bias circuit 310, amplification circuit 320, output matching filter 328, voltage matching circuit 330 (including switching circuit 340), replicator circuit 350, and harmonic filter 358 that selects the fundamental of the replicated signal 246.

Bias circuit 310 outputs first bias voltage Vgn to the gate of transistor 326, and outputs second bias voltage Vg2 to the gate of transistor 324. The gate of transistor 354 is coupled directly to the gate of transistor 545, such that these two transistors both receive second bias voltage Vg2 at their gates.

Amplification circuit 320 receives input voltage Vin at the gate of transistor 322. Transistor 324 is stacked on top of transistor 322, and transistor 326 is stacked on top of transistor 326. Transistor 326 outputs amplified voltage Vamp to output matching filter 328. Alternatively, we can say that amplification circuit 320 gives an output current that, in conjunction with an input impedance of output matching filter 250 creates the output voltage Vamp.

This stacked transistor arrangement may be located in the last stage of an amplification circuit in a cellular phone (not shown). Alternatively, this stacked transistor arrangement may be any other stage in a communication circuit.

Voltage matching circuit 330 includes amplifier 332, capacitor 334, and bias switching circuit 340. Bias switching circuit 340 includes a single pole double throw switch. The switching logic of bias switching circuit 340 may be implemented by other configurations, such as two single pole single throw switches (not shown) connected to the same single pole (single pole 346).

In a first switching configuration (passing DC components and AC components of first bias voltage Vgn) for when input voltage Vin is small, first throw 342 is coupled to single pole 346 as shown. This switching logic may be implemented by using input voltage Vin as bias switching control 348 as shown, or by using some other control signal (not shown) from a voltage matching control circuit (not shown).

In a second switching configuration (passing AC components only of first bias voltage Vgn) for when input voltage Vin is large, second throw 344 is coupled to single pole 346. This second switching configuration is not shown. This switching logic may be implemented by using input voltage Vin as bias switching control 348 as shown, or by using some other control signal (not shown) from a voltage matching control circuit (not shown).

Replicator circuit 350 includes stacked transistors 352, 354, and 356. Transistor 352 receives replicator input voltage RVin at the gate of transistor 352. Replicator input voltage RVin is equal to input voltage Vin. Transistor 354 receives voltage RVg2 at its gate. Voltage RVg2 is equal to second bias voltage Vg2.

Transistor 356 (the top replicator transistor) receives voltage RVgn at its gate. Voltage RVgn is equal to first bias voltage Vgn (AC component and DC component) under the condition that Vin is small and bias switching circuit 340 is set in the first switching configuration (shunting Vgn to RVgn) as discussed above.

Alternately, voltage RVgn is equal to the AC component of Vgn whenever Vin is large and bias switching circuit 340 is set in the second switching configuration (such that capacitor 334 blocks the DC component of Vgn while passing the AC component of Vgn).

For convenience, transistor 326 may be called the first amplification transistor, and transistor 324 may be called the second amplification transistor. Transistor 322 may be called the third amplification transistor.

In replicator circuit 350, transistor 356 may be called the first replicator transistor. Transistor 354 may be called the second replicator transistor, and transistor 352 may be called the third replicator transistor. This first, second, and third terminology is useful for claim language.

Additional transistors (not shown) may be inserted into the stacks as indicated by the three solid dots in amplification circuit 320 and the three solid dots in replicator circuit 350.

FIG. 9 illustrates communication circuitry 460 including an alternative voltage matching circuit 470. FIG. 9 is identical to FIG. 8, except that alternative voltage matching circuit 470 in FIG. 9 has replaced voltage matching circuit 330 in FIG. 8.

In alternative voltage matching circuit 470, the gate of transistor 472 is coupled to the gate of transistor 326, and the source of transistor 472 is coupled to current source 473. Capacitor 474 couples the source of transistor 472 and the gate of transistor 356.

Alternative voltage matching circuit 470 is similar to (but different from) voltage matching circuit 330 of FIG. 8. For example, alternative voltage matching circuit 470 includes transistor 472 having a drain coupled to the drain of transistor 326, whereas voltage matching circuit 330 does not include transistor 472. However, both voltage matching circuits use input voltage Vin as a switching control.

The source of transistor 478 is coupled to the gate of transistor 326. The drain of transistor 478 is coupled to the gate of transistor 356. Capacitor 480 couples the gate of transistor 478 to the gate of transistor 322. Resistor 476 couples the source of transistor 478 to the drain of transistor 478.

In one embodiment, voltage supply 482 is connected to Vgn at a first end and is coupled to a first end of resistor 484 at a second end. A second end of resistor 484 is coupled to the gate of transistor 478. An additional voltage supply (not shown) may be coupled to the source of transistor 478. This voltage supply 482 may be implemented in various ways.

In FIG. 9, first bias voltage Vgn is connected to RVgn at the gate of transistor 356 (in the replicator circuit) when the input voltage Vin is low, and first bias voltage Vgn is disconnected from RVgn at the gate of transistor 356 when input voltage Vin is high. Thus, alternative voltage matching circuit 470 acts very similarly to voltage matching circuit 330 of FIG. 8 in this fashion.

When input voltage Vin is high, transistor 472 and capacitor 474 only pass an AC component from the amplification circuit, and a DC component is provided from voltage supply 482. This alternative voltage matching circuit 470 ensures that voltage RVds in replicator circuit 350 matches voltage Vds in amplification circuit 320, and thus ensures that currents generated by the bottom transistors of the replicator circuit match those of the amplification circuit. This DC component provided from voltage supply 482 is not present in voltage matching circuit 330 in FIG. 8. This ensures that transistor 256 does not enter a triode region while transistor 326 does enter a triode region. This avoids the degradation of the following harmonic filter quality factor through excessive loading.

However, if the capacitance from the amplification circuit and the replicator circuit do not match and have a dynamic (modulated) component, then the dynamic amplitude and phase behavior of replicated voltage Vrep will not match amplified voltage Vamp. FIGS. 10 and 11 below address this issue of trying to match capacitance in order to attempt to match dynamic amplitude and phase behavior. The difference in capacitance may come from transistor 326 entering a triode region while transistor 356 stays in a normal operation region.

FIG. 10 illustrates a communication circuit 400 including a varactor 420 for matching capacitance.

Specifically, FIG. 10 is very similar to FIG. 8, but with the addition of varactor bias circuit 410 and varactor 420 in order to keep dynamic capacitances matching over the entire range of signal variation. Varactor 420 is appropriately biased and is used to keep dynamic capacitances matched between amplification circuit 320 and replicator circuit 350. With respect to FIG. 8, the other components of FIG. 10 are identical to FIG. 8, including voltage matching circuit 330.

Varactor bias circuit 410 and varactor 420 constitute one embodiment of capacitance matching circuit 235 in FIG. 6B.

Varactor bias circuit 410 receives first bias voltage Vgn and generates varactor bias voltage Vbias. In one embodiment, varactor 420 may be connected to other locations in a signal path in replicator circuit 350. Furthermore, additional varactors and additional varactor bias circuits may be used.

Ensuring that the Vgs and Vds of transistor 322 and Vgs and Vds of transistor 352 match will ensure that the currents generated by these two transistors match up to a given constant ratio factor.

However, it is important that the fundamental component of the output current 494 of amplification circuit 320 matches the fundamental component of output current 495 of replicator circuit 350. This is not necessarily maintained even if these currents and their fundamental components are kept equal up to a fixed ratio.

For example, if capacitance Cmain in the amplification circuit 320 at source transistor 326 is different from capacitance Creplicator at the source of transistor 356, then the current 497 deviated by Cmain from signal 493 and the current 492 deviated by Creplicator from current 490 are different, making currents 494 and 495 different (considering the fixed ratio between them).

Varactor 420 and its bias 410 ensure that the total capacitance at the source of transistor 356 (Creplicator+Cvaractor) matches the total capacitance Cmain at the source of transistor 326, ensuring that currents 494 and 495 are equal (up to a fixed ratio), regardless of the different regimes of operation of devices in amplification circuit 320 and replicator circuit 350.

Alternatively, varactor 420 may be controlled by a control signal from a controller (not shown), and varactor bias 410 may be omitted.

FIG. 11 illustrates a communication circuit 409 and provides details for varactor bias circuit 410 and details for varactor 420. The remainder of FIG. 11 is identical to FIG. 9.

Varactor bias circuit 410 includes first resistor 412 and second resistor 414 positioned in series with each other and performing voltage division to generate varactor bias voltage Vbias. Capacitor 416 is in parallel with resistor 412, and helps to process the AC component of first bias voltage Vgn coming from bias circuit 310. Resistors 412 and 414 may be adjusted to tune the performance of varactor bias circuit 410.

Further, varactor bias circuit 410 may be replaced by a varactor bias control circuit (not shown.)

Varactor 410 may include transistor 422 and optional diode 424 configured as shown in FIG. 11 to increase the varactor range. The drain of transistor 422 is coupled to the source of transistor 356. Multiple varactors may be used (not shown).

In FIG. 11, the gate of transistor 422 receives varactor bias voltage Vbias from varactor bias circuit 410, and varactor bias voltage Vbias controls the capacitance of transistor 422 configured as shown with diode 424.

Thus, the capacitance of replicator circuit 350 may be modified to match the capacitance of amplification circuit 320.

FIG. 12 illustrates a communication circuit 500 including a voltage matching circuit with offset 510.

Communication circuit 500 includes three major components: amplification circuit 320 (as described regarding FIG. 8), replicator circuit 350 (as described regarding FIG. 8), and voltage matching circuit with offset 510 (described in detail below). Node 322S is the source of transistor 322, and is coupled to ground through optional inductor 321.

Replicator circuit 350 receives matched voltage RVgn, second bias voltage Vg2, and input voltage Vin, as described above regarding FIG. 8.

Voltage matching circuit with offset 510 receives amplified voltage Vamp, first bias voltage Vgn, second bias voltage Vg2, and input voltage Vin.

Together, voltage matching circuit with offset 510 and replicator circuit 350 may be described as a PM current sensor. As previously discussed in FIGS. 6 and 7, replicator circuit 350 and a correction circuit (not shown) may form a control loop for controlling amplification circuit 320.

Voltage matching circuit with offset 510 includes the following components: capacitor 512, resistor 514, transistor 516, transistor 518, transistor 520, resistor 522, capacitor 524, capacitor 526, transistor 528, resistor 530, coarse offset circuit 532 (including variable current source 533), fine offset circuit 534 (including variable current source 536), and current source 538. These components are organized as shown in FIG. 12.

For small to moderate RF signals, input voltage Vin is low, so transistor 528 acts as a closed switch and then passes bias Vgn to transistor 356 in replicator circuit 350. For these small to moderate RF signals, replicator circuit 350 acts as a scaled version of the amplification circuit, and the transfer function of the amplification circuit 320 is faithfully replicated by the replicator circuit. Thus, the switching logic of voltage matching circuit with offset 510 is similar to that of alternative voltage matching circuit 470 discussed in FIG. 9.

However, as the input voltage Vin increases, transistor 326 begins to go into the linear range during negative peaks of amplified voltage Vamp.

Capacitor 512, resistor 514, transistor 516, and transistor 518 act as an output saturation detector for transistor 326.

Transistor 516 goes into linear (switch on) operation at these conditions and drives the transistor 356 through capacitor 526.

In many cases, significant distortion is created by the last cascade device (such as transistor 326) that is excited to a very large voltage swing Vamp. The distortion is created with respect to the point of crushing transistor 326, i.e., the point when transistor 326 goes from the normal operating region into the trode operating region (for MOSFETs) or into the saturation region for bipolar transistors. Therefore, a saturation detector that senses when transistor device 326 crushes is desirable.

Components 512, 514, 516, 518, and 536 constitute a saturation detector for floating transistor 326. When transistor 516 is in normal operation region it acts as a source follower and passes the AC component of the Vgn voltage to transistor 356. When transistor 516 enters the triode region it will pass some of the Vamp output voltage AC component to the gate of transistor 356.

Blending the DC and AC components of Vgn, the AC component of Vgn and the AC component of output voltage Vamp at different signal power levels results in a more accurate replication of the output current 494 of amplification circuit 320 by the output current 495 of replicator circuit 350.

Transistor 356 in replicator circuit 350 becomes a source follower replicating the Vgn bias of transistor 326. This is done with a very wide bandwidth.

Also, The replicated current in conjunction with the input impedance of the following state (e.g. harmonic filter) generates the replicated voltage Vrep. As discussed above in other figures, replicated voltage Vrep may be used by a correction circuit to generate a control signal for feedback to amplification circuit 320.

Coarse offset circuit 552 including variable current source 533 may be used to make coarse adjustments to improve and optimize the performance of voltage matching circuit with offset 510 by increasing or decreasing the current of current source 533.

Similarly, fine offset circuit 534 including variable current source 536 may be used to make fine adjustments to improve and optimize the performance of voltage matching circuit with offset 510. These offset circuits 532 and 534 refine or adjust the threshold where the output saturation detector becomes active.

Coarse offset current 533 generates a variable offset voltage at the gate of transistor 518. Fine offset current 536 modifies the point where transistor 516 (acting as a switch) gets activated. This allows a better alignment with the moment when the 326 transistor (cascade device) of amplification circuit 320 gets crushed (enters triode region for MOSFTs). This better alignment allows the replicator circuit 350 to follow with a better accuracy while avoiding crushing its own transistors, e.g. transistor 356.

Such alignment is very important for when replicator circuit 350 is used for phase distortion correction, but may be less important when used for gain distortion correction.

As such, a replicator circuit 350 used for gain distortion correction and an additional replicator circuit used for phase distortion correction may each be separately tailored to better replicate the fundamental signal amplitude or phase behavior.

FIG. 13 illustrates a communication circuit 601 including a capacitor compensation circuit 600. Communication circuit 601 is a small portion of voltage matching circuit with offset 510 (not shown) or of capacitance matching circuit 235 (not shown).

Capacitor compensation circuit 600 is similar in function to varactor bias 410 and varactor 420 in FIGS. 10 and 11, as discussed above, and receives first bias voltage Vgn as an input.

Capacitor compensation circuit 600 is coupled to first bias voltage Vgn, is coupled to source node 322S of transistor 322 (not shown), and is coupled to the source of transistor 356.

Capacitor compensation circuit 600 includes transistor 602 coupled to diode 604, transistor 612 coupled to diode 606, and transistor 614 coupled to diode 608, configured as shown. Transistors 610, 612, and 618 may be controlled by control signals (not shown) from a control circuit (not shown). Transistors 610, 612, and 618 constitute a controlled varactor that generates a sophisticated equivalent capacitance to match the capacitance of amplification circuit 320.

When transistor 326 (not shown, top transistor in the amplification circuit) crushes (or goes into the linear region), the capacitance of its transistor channel changes, thus altering the phase and amplitude of any current going through the channel. Before crushing, capacitance Cgs (not shown, capacitance between the gate and the source of transistor 326) is roughly ⅔ of the gate oxide capacitance, and after crushing the entire gate oxide capacitance is present and the drain diode capacitance is shorted to the source through the linear mode. Furthermore, the importance of the impedance (real part) at the source of 326 changes dramatically as the device goes from normal operation into crushed operation.

In order to duplicate this behavior in the replicator circuit, capacitor compensation circuit 600 is added in FIG. 13. This capacitor compensation circuit 600 may be described as being part of a voltage matching circuit, or described as part of a replicator circuit, or described as being a separate circuit.

Capacitor compensation circuit 600 adds capacitance such that when transistor 326 goes into the linear region, then capacitance is added to replicator circuit 350.

A voltage offset circuit (not shown) may be added to the gate of capacitor compensation circuit 600 to adjust its offset, and a small capacitance DAC (digital to analog converter, not shown) may be added to capacitor compensation circuit 600 to tune performance. Other types of multi-stage and/or multi-segment varactors may be used.

FIG. 14 illustrates communication circuit 650 including phase feedback circuit 660 and amplitude feedback circuit 670. Thus, phase feedback and amplitude feedback may be distinct circuits, and may be slightly different from each other. Various replicator circuits were discussed in detail in previous figures.

Phase feedback circuit 660 includes phase replicator circuit 198-P, correction circuit 202-P, and optionally may include switch 205-P.

Phase replicator circuit 198-P receives sensed signal 196-P, and generates replicator signal 200-P. Sensed signal 196-P may include first bias voltage Vgn, second bias voltage Vg2, and/or input voltage Vin as discussed above. Sensed signal 196-P may also include outputs from a voltage matching circuit 330 (or 470 or 510), or from varactor 420, or from capacitor compensation circuit 600 as described above.

Correction circuit 202-P receives replicated signal 200P, and generates control signal 204-P. Control signal 204-P may pass through optional switch 205-P on the way to amplification circuit 166. As described in other provisional applications that have been incorporated by reference, control signals may be used as feedback or as feed forward signals in a control loop.

Phase replicator circuit 198-P may be optimized to accurately replicate phases, for example by adjusting internal offsets or capacitance. For example, coarse offset 532, and/or fine offset 534, and/or capacitor compensation circuit 600 may be adjusted.

Amplitude feedback circuit 670 includes amplitude replicator circuit 198-A, correction circuit 202-A, and optionally includes switch 205-A.

Amplitude replicator circuit 198-A receives sensed signal 196-A, and generates replicator signal 200-A. Sensed signal 196-A may include first bias voltage Vgn, second bias voltage Vg2, and/or input voltage Vin as discussed above. Sensed signal 196-A may also include outputs from a voltage matching circuit 330 (or 470 or 510), or from varactor 420, or from capacitor compensation circuit 600 as described above.

Correction circuit 202-A receives replicator signal 200-A and generates control signal 204-A. Control signal 204-A may pass through optional switch 205-A on its way to amplification circuit 166. As described in other provisional applications that have been incorporated by reference, control signals may be used as feedback or as feed forward signals in a control loop.

Further, as described in other provisional applications that have been incorporated by reference, amplitude distortion and phase distortion are correlated. Thus, amplitude feedback circuit 670 may measure amplitude distortion in output signal 192, and use control signal 204-A to correct phase distortion in amplification circuit 166.

Amplitude replicator circuit 198-A may be optimized to accurately replicate amplitude, for example by adjusting internal offsets or capacitance. For example, coarse offset 532, and/or fine offset 534, and/or capacitor compensation circuit 600 may be adjusted.

Switches 205-P and 205-A facilitate using one or more of these feedback circuits intermittently, or for calibration. The calibration may include comparing the sensed signal (196-P and/or 196-A) against a reference signal (not shown).

FIG. 15 illustrates communication circuit 700 including variable replicator circuit 198-VAR.

Amplification circuit 166 and correction circuit 202 were discussed above in FIG. 6.

Variable replicator circuit 198-VAR has a variable gain that is controlled by gain signal 724 from total radiated power (TRP) circuit 720.

Voltage detector 710 receives output signal 192, and generates sensed signal 712. Voltage detector 710 has some disadvantages caused by interactions with an antenna (not shown) coupled to output node 194.

Total radiated power circuit 720 receives sensed signal 712 and also receives replicator signal 200 (such as replicator voltage Vrep), and then measures load variations (such as from an antenna, not shown) and generates gain signal 724 and total radiated power signal 722. Total radiated power circuit 720 is coupled to reference load Zref.

Variable replicator circuit 198-VAR receives sensed signal 196 from amplification circuit 166 and receives gain signal 724 from total radiated power circuit 719, and generates replicator signal 200.

Correction circuit 202 receives replicator signal 200 from variable replicator circuit 198-VAR, receives total radiated power signal 722 from total radiated power circuit 720, and receives reference signal 740 (equivalent to input signal 164). Correction circuit 202 generates control signal 204 and sends control signal 204 to amplifier circuit 166 as a feedback signal or as a feed forward signal. Control signal 204 may comprise multiple control signals, such as a feedback signal and a feed forward signal.

Thus, the total radiated power circuit 720 exerts (through gain signal 724) a direct control of variable replicator circuit 198-VAR, which in turn can impact the distortion correction circuit.

In one embodiment, the variable gain of the variable replicator circuit 198-VAR of an amplitude feedback linearization loop results in keeping the total radiated power going to the load relatively constant. This variable gain may improve the stability of an amplitude feedback linearization loop by keeping the loop gain from varying widely as the load VSWR changes.

Those skilled in the art will recognize improvements and modifications to the preferred embodiments of the present disclosure. All such improvements and modifications are considered within the scope of the concepts disclosed herein and the claims that follow.

What is claimed is:

1. A communication circuit comprising:
   an amplification circuit configured to receive an input signal, to generate a sensed signal, and to generate an amplified signal;
   a replicator circuit configured to receive the sensed signal from the amplification circuit, and to generate a replicated signal approximately equal to the amplified signal; and
   a correction circuit configured to receive the replicated signal, to generate a control signal, and to send the control signal to the amplification circuit such that the replicator circuit and the correction circuit form a control loop.

2. The communication circuit of claim 1, wherein the replicator circuit includes a replicator transistor configured to emulate an amplification transistor in the amplification circuit, and wherein an active area of the replicator transistor is at least ten times smaller than an active area of the amplification transistor.

3. The communication circuit of claim 1, further comprising:
   a voltage matching circuit configured to provide a matched signal to the replicator circuit.

4. The communication circuit of claim 3, wherein the voltage matching circuit includes a switching circuit configured to pass a first bias voltage from the amplification circuit to the replicator circuit when an input signal to the amplification circuit is high.

5. The communication circuit of claim 4, further comprising:
   a capacitance matching circuit, wherein the capacitance matching circuit includes:
   a varactor bias; and
   a varactor controlled by the varactor bias, and
   wherein the varactor is coupled to a signal path at the replicator circuit.

6. The communication circuit of claim 3, wherein the voltage matching circuit includes an offset circuit.

7. The communication circuit of claim 1, further comprising:
   a capacitor compensation circuit configured to replicate a nonlinear capacitance from the amplification circuit.

8. The communication circuit of claim 1, wherein the replicator circuit is optimized to accurately replicate an amplitude of the amplification circuit.

9. The communication circuit of claim 1, wherein the replicator circuit is optimized to accurately replicate a phase of the amplification circuit.

10. The communication circuit of claim 1, further comprising:
a total radiated power circuit configured to send a total radiated power signal to the correction circuit.

11. The communication circuit of claim 1, wherein the correction circuit includes a gain correction circuit and a phase correction circuit.

12. The communication circuit of claim 11, wherein the gain correction circuit and the phase correction circuit share the replicated signal from the replicator circuit.

13. The communication circuit of claim 11, further comprising:
an additional replicator circuit configured to generate an additional replicated signal, and
wherein the gain correction circuit receives the replicated signal, and
wherein the phase correction circuit receives the additional replicated signal.

14. The communication circuit of claim 1, wherein the replicator circuit is configured for use in a circuit with intermittent operation.

15. A communication circuit comprising:
an amplification circuit; and
a replicator circuit associated with the amplification circuit, the replicator circuit including:
a first replicator transistor;
a second replicator transistor stacked above the first replicator transistor, and
a third replicator transistor stacked above the second replicator transistor, and
wherein the first replicator transistor has a smaller first active area than a first amplification transistor in the amplification circuit,
wherein the second replicator transistor has smaller second active area than a second amplification transistor in the amplification circuit, and
wherein the third replicator transistor has a smaller third active area than a third amplification transistor in the amplification circuit.

16. The communication circuit of claim 15, further comprising:
a voltage matching circuit coupled to a gate of the first replicator transistor, wherein the voltage matching circuit includes a switching circuit.

17. The communication circuit of claim 16, wherein the switching circuit is configured to pass a first bias voltage to a gate of the first replicator transistor whenever an input signal to the amplification circuit is high.

18. The communication circuit of claim 15,
wherein a gate of the first replicator transistor is coupled directly to a gate of the first amplification transistor,
wherein a gate of the second replicator transistor is coupled directly to a gate of the second amplification transistor; and
wherein a gate of the third replicator transistor is coupled to a gate of the third amplification transistor through a voltage matching circuit.

19. The communication circuit of claim 15, further comprising:
a varactor bias circuit; and
a varactor controlled by the varactor bias circuit and coupled to a source of the first replicator transistor.

20. A communication circuit comprising:
an amplification circuit configured to receive an input signal, to generate a first intermediate signal, a second intermediate signal, and to generate an amplified signal, wherein the amplified signal includes a first fundamental component;
a replicator circuit configured to receive the input signal, to receive the second intermediate signal, and to generate a replicated signal, wherein the replicated signal includes a second fundamental component that accurately replicates the first fundamental component; and
a first signal matching circuit configured to modify the second intermediate signal such that the second intermediate signal accurately replicates the first intermediate signal.

21. The communication circuit of claim 20, further comprising:
a capacitance matching circuit configured to vary a first capacitance such that a second capacitance in a signal path in the amplification circuit maintains a constant ratio relative to a second capacitance in a signal path in the replicator circuit.

22. The communication circuit of claim 20, wherein the amplified signal is a first current, and wherein the replicated signal is a second current.

23. The communication circuit of claim 20, wherein the amplified signal is a first voltage, and wherein the replicated signal is a second voltage.

24. The communication circuit of claim 21, wherein the capacitance matching circuit includes multiple varactors, and includes multiple bias circuits configured to control the multiple varactors.

25. The communication circuit of claim 24, wherein each of the multiple varactors is connected to a different location in the replicator circuit.

26. The communication circuit of claim 20, further comprising:
a second signal matching circuit configured to modify an additional intermediate signal in the replicator circuit to accurately replicate an additional intermediate signal in the amplification circuit.

27. The communication circuit of claim 20, wherein a first offset signal for the first signal matching circuit is generated using analog techniques.

28. The communication circuit of claim 20, wherein a first offset signal for the first signal matching circuit is generated using mixed signal digital-analog techniques.

* * * * *